United States Patent
Aweya

(10) Patent No.: US 9,531,395 B2
(45) Date of Patent: Dec. 27, 2016

(54) METHOD AND DEVICES FOR TIME AND FREQUENCY SYNCHRONIZATION USING A PHASE LOCKED LOOP

(71) Applicants: Khalifa University of Science, Technology, and Research, Abu Dhabi (AE); British Telecommunications plc, London (GB); Emirates Telecommunications Corporation, Abu Dhabi (AE)

(72) Inventor: James Aweya, Abu Dhabi (AE)

(73) Assignees: Khalifa University of Science, Technology and Research, Abu Dhabi (AE); Emirates Telecommunications Corporation, Abu Dhabi (AE); British Telecommunications Corporation, London (GB)

( * ) Notice: Subject to any disclaimer, the term of this patent is extended or adjusted under 35 U.S.C. 154(b) by 486 days.

(21) Appl. No.: 14/044,075

(22) Filed: Oct. 2, 2013

(65) Prior Publication Data
US 2015/0092797 A1   Apr. 2, 2015

(51) Int. Cl.
H04J 3/06   (2006.01)
H03L 7/197   (2006.01)

(52) U.S. Cl.
CPC .......... *H03L 7/1976* (2013.01); *H04J 3/0667* (2013.01); *H04J 3/0697* (2013.01); *H03L 2207/50* (2013.01)

(58) Field of Classification Search
CPC ................. H04L 7/00; H04L 7/04; H04L 7/06
See application file for complete search history.

(56) References Cited

U.S. PATENT DOCUMENTS

| 7,656,985 B1 * | 2/2010 | Aweya | H03L 7/093 331/16 |
| 7,860,205 B1 * | 12/2010 | Aweya | H03L 7/093 370/497 |
| 8,536,911 B1 | 9/2013 | Nakamuta et al. | |

(Continued)

FOREIGN PATENT DOCUMENTS

| EP | 0 697 774 | 2/1996 | |
| EP | EP 0697774 A1 * | 2/1996 | ............... G04G 7/00 |

OTHER PUBLICATIONS

M. Ouellette, Kuiwen Ji, Song Liu, and Han Li, "Using IEEE 1588 and boundary clocks for clock synchronization in telecom networks," IEEE Commun. Mag., Feb. 2011, pp. 164-171.

(Continued)

*Primary Examiner* — Jaison Joseph
(74) *Attorney, Agent, or Firm* — Calfee, Halter & Griswold, LLP

(57) ABSTRACT

This invention relates to methods and devices for time and frequency synchronization, especially over packet networks using, for example, the IEEE 1588 Precision Time Protocol (PTP). Timing protocol messages are exposed to artifacts in the network such as packet delay variations (PDV) or packet losses. Embodiments of the invention provide a digital phase locked loop (DPLL) based on direct digital synthesis to provide both time and frequency signals for use at the slave (time client). An example of this DPLL in conjunction with a recursive least squares mechanism for clock offset and skew estimation is also provided.

27 Claims, 11 Drawing Sheets

(56) References Cited

U.S. PATENT DOCUMENTS

| | | | |
|---|---|---|---|
| 2006/0056560 A1* | 3/2006 | Aweya | H04J 3/0664 375/356 |
| 2006/0056563 A1* | 3/2006 | Aweya | H03D 13/002 375/376 |
| 2007/0097947 A1* | 5/2007 | Aweya | H04J 3/065 370/350 |
| 2007/0174371 A1 | 7/2007 | Merlo et al. | |
| 2010/0054283 A1 | 3/2010 | Jin | |
| 2013/0034197 A1 | 2/2013 | Aweya et al. | |

OTHER PUBLICATIONS

M. Ouellette, G. Garner, and S. Jobert, "Simulations of a chain of Telecom Boundary Clocks combined with Synchronous Ethernet for phase/time transfer," 2011 International IEEE Symposium on Precision Clock Synchronization for Measurement Control and Communication (ISPCS), Sep. 12-16, 2011, pp. 105-113.

R. E. Kalman, "A New Approach to Linear Filtering and Prediction Problems," Transaction of the ASME—Journal of Basic Engineering, Mar. 1960, pp. 35-45.

B. Chun, B. Kim; Y. H. Lee, "Generalization of exponentially weighted RLS algorithm based on a state-space model," Proc. of the 1998 IEEE Inter. Symp. on Circuits and Systems, vol. 5, 1998, pp. 198-201.

H. Kim, X. Ma, B. R. Hamilton, "Tracking Low-Precision Clocks with Time-Varying Drifts Using Kalman Filtering" IEEE/ACM Transactions on Networking, vol. 20, No. 1, Feb. 2012, pp. 257-270.

International Search Report dated May 19, 2014, for International Application Serial No. PCT/GB2013/052568.

Written Opinion dated May 19, 2014, for International Application Serial No. PCT/GB2013/052568.

Non-Final Office Action for related case, U.S. Appl. No. 14/044,068, dated Apr. 7, 2016.

* cited by examiner

METHOD AND DEVICES FOR TIME AND FREQUENCY SYNCHRONIZATION USING A PHASE LOCKED LOOP

FIELD OF THE INVENTION

The present invention relates to methods and devices for time and frequency synchronization. It is particularly, but not exclusively, concerned with time and frequency synchronization over packet networks using, for example, the IEEE 1588 Precision Time Protocol (PTP) using a phase locked loop.

BACKGROUND OF THE INVENTION

Mobile networks fall into two categories, Frequency Division Duplexing (FDD), which uses two separated frequency bands to transmit/receive, and Time Division Duplexing (TDD), which transmits and receives on a single frequency band. Time synchronization (in addition to frequency synchronization) is needed for LTE-TDD, WiMAX TDD, CDMA networks (popular in North America), TD-CDMA and TD-SCDMA, while only frequency synchronization is required for LTE-FDD, GSM (global system for mobile communications), W-CDMA, and other wireless technologies. Even with the use of LTE-FDD, new LTE mobile services such as network MIMO and location-based services will demand accurate time synchronization.

The present invention has particular application to clock synchronization (both time and frequency) over packet networks, specifically with the synchronization of telecom networks. Unlike IT computing systems and sensor networks, which require millisecond level accuracies to operate well, telecom networks require sub microsecond (in fact, nanosecond) level accuracies. Such stringent clock quality levels have traditionally been provided by GPS, atomic clocks, and TDM timing links. For these reasons, the ITU-T, IEEE, and other standards bodies have defined special standards to allow packet networks to support the special synchronization needs of telecom networks. One such recent standard that is now widely accepted and adopted by the telecom industry is the IEEE 1588 Precision Timing Protocol (PTP). There is even a special IEEE 1588 profile defined for telecom applications. Even though time synchronization for IT computing systems and sensor networks have the same underlying concepts, these systems have different application requirements, protocols, architectures, and implementation goals and therefore considered completely out of scope of telecom synchronization.

IEEE 1588 is now the industry accepted packet-based method/standard for distributing timing information from a master to enable the clocks of distributed systems to be synchronized with high precision (accuracies in the nanosecond levels). Its underlying principle is a master/slave concept based on the regular exchange of synchronization messages as shown in FIG. 1, whereby a slave clock 5 in a slave device 3 is synchronized to a master clock 4 in a master device 1 by the exchange of messages over the packet network 2.

IEEE 1588 synchronizes all clocks within a network by adjusting clocks to the highest quality clock (GrandMaster clock). IEEE 1588 supports both frequency and time transfer unlike another packet-based technique called Synchronous Ethernet with supports only frequency transfer. IEEE 1588 defines a wide range of synchronization capabilities except the clock recovery mechanisms (servo algorithm, PLL, timers, etc.) to be used at the slave (client) to synchronize its local clock to the master.

In the case where clock transfers have to be done end-to-end with no assistance from the packet network (for example in the form of hop-by-hop Boundary Clocks (BCs) [1][2] or Transparent Clocks (TCs)), there are no reference clocks traceable to a Primary Reference Clock (PRC) at both ends of the packet network, or in the absence of a network-wide GPS service, a receiving timing-dependent terminal node has to use an adaptive timing technique to reconstruct the timing signal of the transmitting timing reference source. The receiving terminal would commonly use a "packet-based" clock recovery mechanism that slaves the receiver clock to a transmitter clock. The clock recovery mechanism is able to process transmitted clock samples (timestamps) encoded within the packet data stream to generate timing signal for the receiver. The purpose of the clock recovery mechanism is to estimate and compensate for the frequency drift occurring between the oscillators of the transmitter clock and the receiver clock. However, the presence of packet delay variation (PDV) and packet losses affects the performance of the clock estimation/compensation process, making the transmitter clock appear faster or slower than it actually is, and ultimately, causing the propagation of mostly wander up to the receiver clock signal. Wander is clock noise less 10 Hz while jitter is clock noise equal or greater than 10 Hz.

Basics of IEEE 1588 PTP

A clock whether physical or virtual can be used to associate an event with time. The time of a single event is called a timestamp and is a real number. In IEEE 1588v2 PTP messages are categorized into event and general messages. All IEEE 1588 PTP messages have a common header. Event messages are timed messages in that an accurate timestamp is generated at both transmission and receipt of each message. Event messages have to be accurately time-stamped since the accuracy in transmission and receipt timestamps directly affects clock distribution accuracy.

General messages are not required to be timestamped. A timestamp event is generated at the time of transmission and reception of any event message. The set of event messages consists of Sync, Delay_Req, Pdelay_Req, and Pdelay_Resp. The set of general messages consists of Announce, Follow_Up, Delay_Resp, Pdelay_Resp_Follow_Up, Management, and Signaling. IEEE 1588 PTP allows for two different types of timestamping methods, either one-step or two-step. One-step clocks update time information within event messages (Sync and Delay-Req) on-the-fly, while two-step clocks convey the precise timestamps of packets in general messages (Follow_Up and Delay-Resp).

The Sync, Delay_Req, Follow_Up, and Delay_Resp messages are used to generate and communicate the timing information needed to synchronize ordinary and boundary clocks using the delay request-response mechanism. A Sync message is transmitted by a master to its slaves and either contains the exact time of its transmission or is followed by a Follow_Up message containing this time. In a two-step ordinary or boundary clock, the Follow_Up message communicates the value of the departure timestamp for a particular Sync message. A Delay_Req message is a request for the receiving node to return the time at which the Delay_Req message was received, using a Delay_Resp message.

The basic pattern of synchronization message exchanges for the two-step clocks are illustrated in FIG. 1. The message exchange pattern for the two-step clock can be explained as follows. The master 1 sends a Sync message to the slave 3 and notes the time T1 at which it was sent. The slave 3 receives the Sync message and notes the time of reception T2 according to its local clock 5. The master 1 conveys to the slave the timestamp T1 by one of two ways: 1) Embedding the timestamp T1 in the Sync message (not shown). This requires some sort of hardware processing (i.e., hardware timestamping) for highest accuracy and precision. 2) Embedding the timestamp T1 in a Follow_Up message as shown in FIG. 1. Next, the slave 3 sends a Delay_Req message to the master 1 and notes the time T3 at which it was sent. The master 1 receives the Delay_Req message and notes the time of reception T4. The master 1 conveys to the slave 3 the timestamp T4 by embedding it in a Delay_Resp message.

At the end of this PTP message exchange, the slave 3 possesses all four timestamps {T1, T2, T3, T4}. These timestamps may be used to compute the offset of the slave's clock 5 with respect to the master clock 4 and the mean propagation time of messages between the two clocks. The computation of offset and propagation time assumes that the master-to-slave and slave-to-master propagation times are equal symmetrical communication path.

Time/frequency can be transferred in an end-to-end fashion from master 1 to slave 3 without involving the intermediate network nodes 6 as illustrated in FIG. 2. In this scenario the slave 3 is solely responsible for correctly recovering the master clock signal. Compared to the other methods (e.g., using hop-by-hop Boundary Clocks or Transparent Clocks), time/frequency transfer here is more challenging because the slave 3 is exposed to all the PDV generated by the intermediate packet network 2 (FIG. 3 and FIG. 4). The processing and buffering of packets in network devices (switches, routers, etc.) introduces variations in the time latency of packets traversing the packet network 2 that tend to degrade the clock signal transferred. The PDV inherent in packet networks is a primary source of clock noise. The recovered clock from the PTP timing signal at the slave contains clock noise (contributed largely by PDV) that needs to be removed or attenuated. A filtering process is used at the slave to filter out the clock noise, thus generating a "smooth" clock output.

SUMMARY OF THE INVENTION

An exemplary embodiment of the invention provides a slave device connected to a master device having a master clock over a network, wherein the slave device includes: a slave clock; and a digital phase locked loop including a phase detector, a loop filter, a phase accumulator and a counter, wherein: the slave device is arranged to: exchange with the master device, timing messages and to record timestamps which are: the time of sending of said timing messages from the master device according to the master clock; the time of receipt of said timing messages according to the slave clock; the time of sending of said timing messages according to the slave clock; and the time of receipt of said timing messages according to the master clock, estimate the skew and offset of the slave clock relative to the master clock from said timestamps; and synchronize said slave clock to the master clock based on the estimated skew and offset to produce a master time estimate; the digital phase locked loop processes the master time estimate as follows: on receipt of a first estimate of the master time, the counter is initialised; on receipt of subsequent estimates of the master time, the phase detector is arranged to detect a phase difference between the output of the counter and the received estimate and produce an error signal representing that difference; the error signal is filtered by the loop filter to produce a filtered error signal; the filtered error signal is used to control the frequency of the phase accumulator; and the output of the phase accumulator increments the counter and also provides a clock frequency of the slave clock which is synchronized to the frequency of the master clock.

A further exemplary embodiment of the invention provides a method of synchronizing the time and frequency of a slave clock in a slave device to a master clock in a master device which is connected to the slave device over a network, the method including the steps of: exchanging, between the master device and the slave device, timing messages and timestamps which are: the time of sending of timing messages from the master device according to the master clock; the time of receipt of said timing messages according to the slave clock; the time of sending of said timing messages according to the slave clock; and the time of receipt of said timing messages according to the master clock, estimating the skew and offset of the slave clock relative to the master clock from said timestamps; and synchronizing said slave clock to the master clock based on the estimated skew and offset to produce a master time estimate; using a digital phase locked loop including a phase detector, a loop filter, a phase accumulator and a counter, processing the master time estimate as follows: on receipt of a first estimate of the master time, initializing the counter; on receipt of subsequent estimates of the master time, detecting, using the phase detector, a phase difference between the output of the counter and the received estimate and producing an error signal representing that difference; filtering the error signal using the loop filter to produce a filtered error signal; controlling the frequency of the phase accumulator using the filtered error signal; and incrementing counter using the output of the phase accumulator, and obtaining a clock frequency of the slave clock which is synchronized to the frequency of the master clock as the output of the phase accumulator.

A further exemplary embodiment of the invention provides a time and frequency synchronisation system for a network, the system including: a master device having a master clock; a slave device having a slave clock; and a network connecting the master and slave devices, wherein: the slave clock comprises: a slave clock; and a digital phase locked loop including a phase detector, a loop filter, a phase accumulator and a counter, wherein: the slave device is arranged to: exchange with the master device, timing messages and to record timestamps which are: the time of sending of said timing messages from the master device according to the master clock; the time of receipt of said timing messages according to the slave clock; the time of sending of said timing messages according to the slave clock; and the time of receipt of said timing messages according to the master clock, estimate the skew and offset of the slave clock relative to the master clock from said timestamps; and synchronize said slave clock to the master clock based on the estimated skew and offset to produce a master time estimate; the digital phase locked loop processes the master time estimate as follows: on receipt of a first estimate of the master time, the counter is initialised; on receipt of subsequent estimates of the master time, the phase detector is arranged to detect a phase difference between the output of the counter and the received estimate and produce an error signal representing that difference; the error signal is filtered by the loop filter to produce a filtered error signal; the filtered error signal is used to control the frequency of the phase accumulator; and the output of the phase accumulator increments the counter and also provides a clock frequency of the slave clock which is synchronized to the frequency of the master clock.

BRIEF DESCRIPTION OF THE DRAWINGS

Embodiments of the invention will now be described by way of example with reference to the accompanying drawings in which.

DETAILED DESCRIPTION

Figure 1:
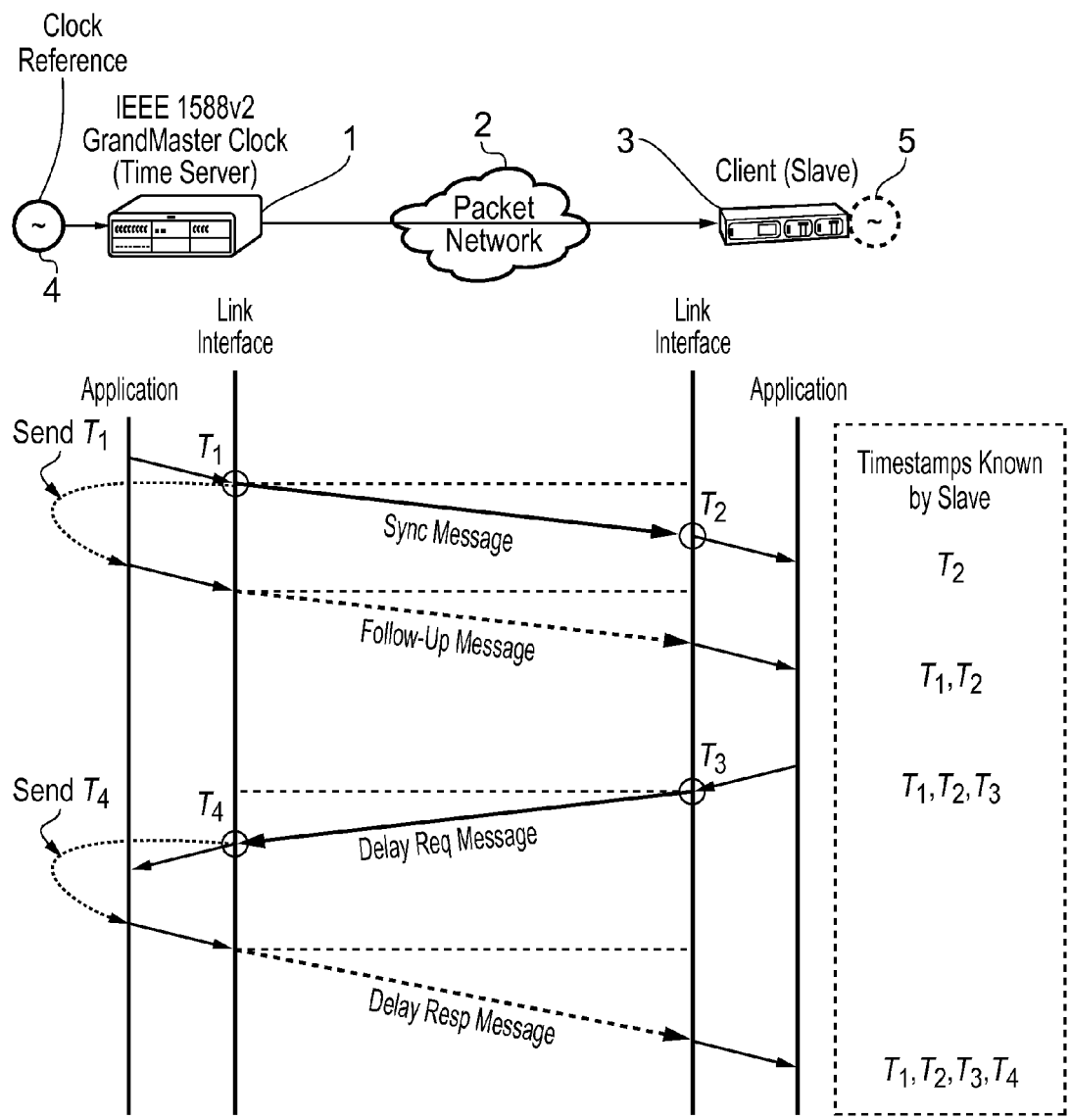
FIG. 1 shows the message flow in a two-step clock under IEEE 1588 PTP and has already been described.
Figure 2:
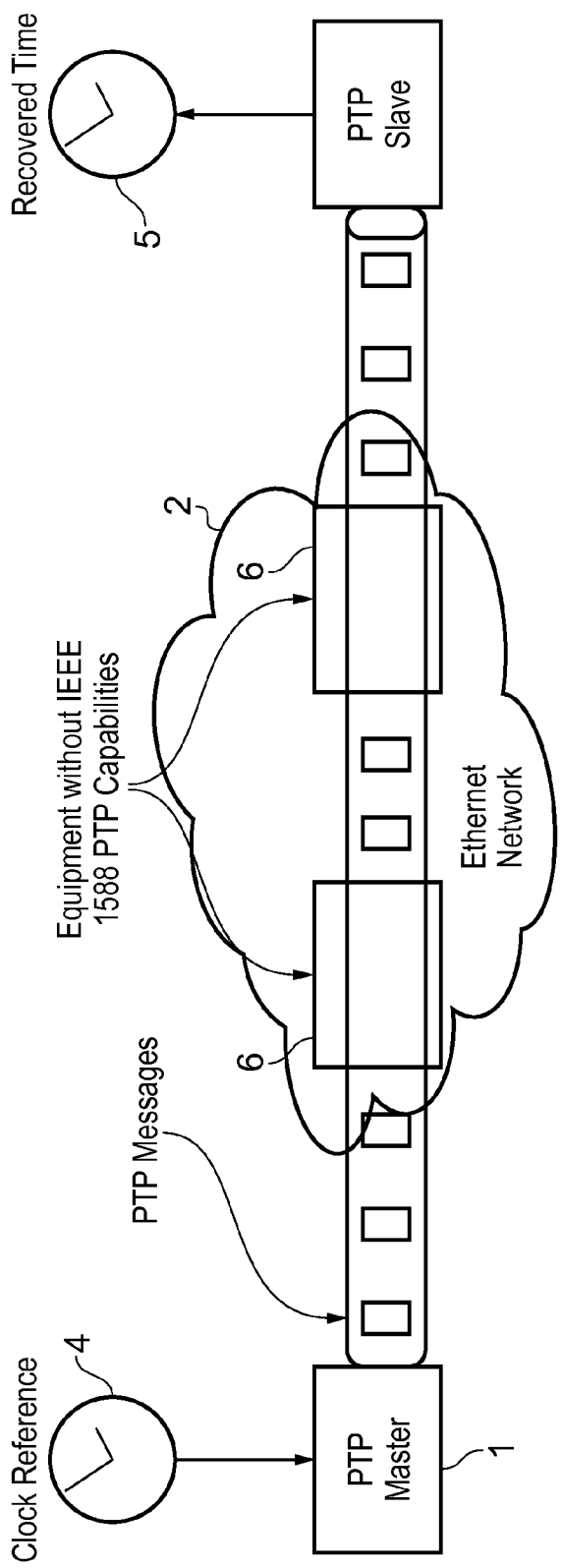
FIG. 2 shows end-to-end time/frequency transfer over a network and has already been described.
Figure 3:
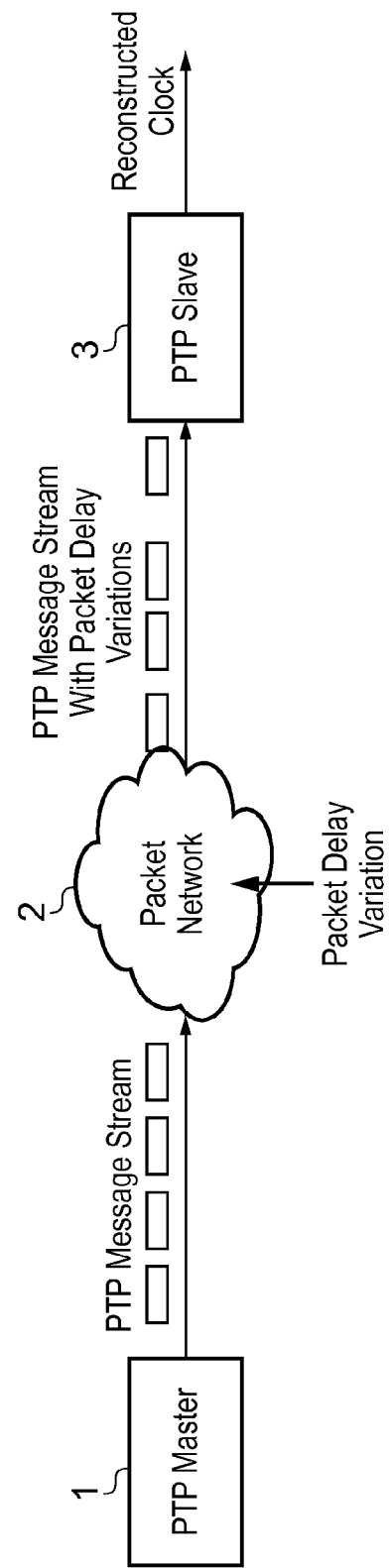
FIG. 3 shows, in schematic form, the effect of Packet Delay Variation in a packet network and has already been described.
Figure 4:
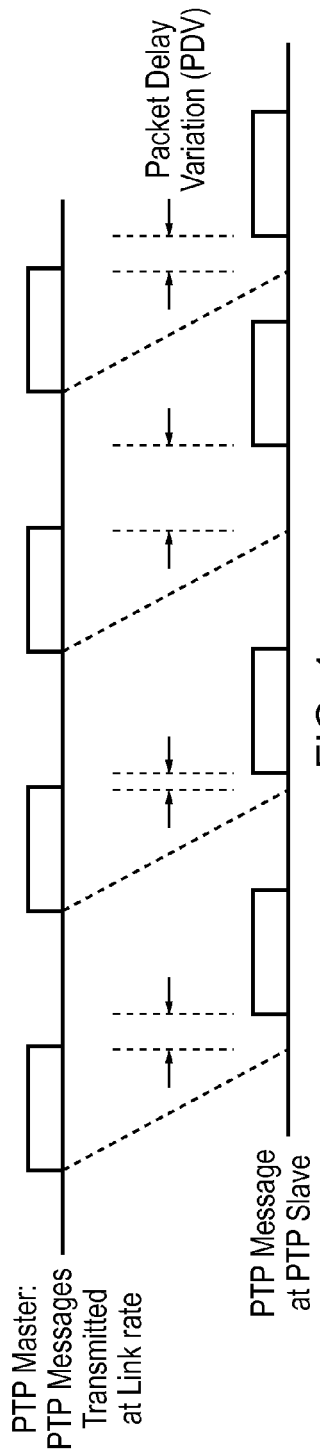
FIG. 4 shows the effects of Packet Delay Variation on a PTP message stream and has already been described.

At their broadest, slave devices of the present invention include a slave clock and a phase locked loop which is used to process an estimate of the time and frequency of a master clock to which the slave clock is desired to be synchronized.

A first aspect of the present invention provides a slave device connected to a master device having a master clock over a network, wherein the slave device includes: a slave clock; and a digital phase locked loop including a phase detector, a loop filter, a phase accumulator and a counter, wherein: the slave device is arranged to: exchange with the master device, timing messages and to record timestamps which are: the time of sending of said timing messages from the master device according to the master clock; the time of receipt of said timing messages according to the slave clock; the time of sending of said timing messages according to the slave clock; and the time of receipt of said timing messages according to the master clock, estimate the skew and offset of the slave clock relative to the master clock from said timestamps; and synchronize said slave clock to the master clock based on the estimated skew and offset to produce a master time estimate; the digital phase locked loop processes the master time estimate as follows: on receipt of a first estimate of the master time, the counter is initialised; on receipt of subsequent estimates of the master time, the phase detector is arranged to detect a phase difference between the output of the counter and the received estimate and produce an error signal representing that difference; the error signal is filtered by the loop filter to produce a filtered error signal; the filtered error signal is used to control the frequency of the phase accumulator; and the output of the phase accumulator increments the counter and also provides a clock frequency of the slave clock which is synchronized to the frequency of the master clock.

The digital phase locked loop in the slave device can be used to attenuate the clock noise introduced by the network (which may be, for example, a packet network) to levels commensurate with the clock output requirements of the application.

Preferably the timing messages are messages under the IEEE 1588 PTP, for example, Sync, Follow_Up, Delay_Req or Delay_Response messages.

Preferably the slave device uses the output of the counter as the clock time of the slave clock which is synchronized to the time of the master clock.

The slave device of this aspect can therefore provide a timestamp-based clock recovery technique for end-to-end time and frequency distribution over packet networks. This technique requires no assistance from the packet network and is still able to provide sub-microsecond level clock accuracies. The digital phase locked loop can provide both time and frequency signals for use at the slave (time client). Most techniques, typically, provide only one signal type, not both.

The counter output (time signal) can be subsequently formatted into various standard time signals as required.

The slave device of this aspect may further comprise a direct digital synthesizer producing an analog frequency signal from the output of the phase accumulator, the direct digital synthesizer including: the phase accumulator; an oscillator; a mapping device; and a digital-to-analog converter. The slave device may further comprise a low-pass filter arranged to filter the output of the direct digital synthesizer.

The slave device may process or condition the output of the phase accumulator in other ways to provide a signal that meets the jitter requirements of the end applications in the slave device. Various forms of signals (square wave, sine wave, etc.) with interface form factors can be constructed from the phase accumulator overflow output. These signals can be conditioned by another (typically analog) phase locked loop.

In one embodiment, the counter of the digital phase locked loop is also used to provide timestamps for the time of receipt and of sending of timing messages at/from the slave device.

In this embodiment the counter may be initialized on receipt by the slave device of the first timing message from the master device, and the counter may be reset on receipt of the first master time estimate to said first master time estimate.

In an alternative embodiment, the slave device further comprises a second free-running counter, wherein the second counter is used to provide timestamps for the time of receipt and sending of timing messages at/from the slave device.

The slave device preferably produces the master time estimate using a recursive technique for estimating the clock offset and skew (of the slave with respect to the master). The recursive estimation technique is preferably an exponentially weighted recursive least squares method which is Kalman Filter like in structure but does not require knowledge of the measurement and process noise statistics as in the traditional Kalman Filter. An example of such a method is described in the embodiments below.

The slave device of this aspect preferably operates by carrying out the relevant steps of a method according to the second aspect described below.

The slave device of the present aspect may include any combination of some, all or none of the above described preferred and optional features.

At their broadest, methods of the present invention provide for methods of synchronizing the time and frequency of a slave clock to a master clock by using a phase locked loop to process an initial estimate of the time and frequency of the master clock in the slave device.

A second aspect of the present invention provides a method of synchronizing the time and frequency of a slave clock in a slave device to a master clock in a master device which is connected to the slave device over a network, the method including the steps of: exchanging, between the master device and the slave device, timing messages and timestamps which are: the time of sending of timing messages from the master device according to the master clock; the time of receipt of said timing messages according to the slave clock; the time of sending of said timing messages according to the slave clock; and the time of receipt of said timing messages according to the master clock, estimating the skew and offset of the slave clock relative to the master clock from said timestamps; and synchronizing said slave clock to the master clock based on the estimated skew and offset to produce a master time estimate; using a digital phase locked loop including a phase detector, a loop filter, a phase accumulator and a counter, processing the master time estimate as follows: on receipt of a first estimate of the master time, initializing the counter; on receipt of subsequent estimates of the master time, detecting, using the phase detector, a phase difference between the output of the counter and the received estimate and producing an error signal representing that difference; filtering the error signal using the loop filter to produce a filtered error signal; controlling the frequency of the phase accumulator using the filtered error signal; and incrementing counter using the output of the phase accumulator, and obtaining a clock frequency of the slave clock which is synchronized to the frequency of the master clock as the output of the phase accumulator.

The digital phase locked loop in the slave device can be used to attenuate the clock noise introduced by the network (which may be, for example, a packet network) to levels commensurate with the clock output requirements of the application.

Preferably the timing messages are messages under the IEEE 1588 PTP, for example, Sync, Follow_Up, Delay_Req or Delay_Response messages.

Preferably the method further includes the step of using the output of the counter as the clock time of the slave clock which is synchronized to the time of the master clock.

The method of this aspect can therefore provide a timestamp-based clock recovery technique for end-to-end time and frequency distribution over packet networks. This technique requires no assistance from the packet network and is still able to provide sub-microsecond level clock accuracies. The digital phase locked loop can provide both time and frequency signals for use at the slave (time client). Most techniques, typically, provide only one signal type, not both.

The counter output (time signal) can be subsequently formatted into various standard time signals as required.

The method of this aspect may further include the step of producing an analog frequency signal from the output of the phase accumulator using a direct digital synthesizer including the steps of: mapping the output of the phase accumulator to produce a digital waveform; and converting said digital waveform to an analog waveform using a digital-to-analog converter. The method may further include the step of low-pass filtering the analog waveform to produce a smoothed waveform.

The method may process or condition the output of the phase accumulator in other ways to provide a signal that meets the jitter requirements of the end applications in the slave device. Various forms of signals (square wave, sine wave, etc.) with interface form factors can be constructed from the phase accumulator overflow output. These signals can be conditioned by another (typically analog) phase locked loop.

In one embodiment, the timestamps for the time of receipt and of sending of timing messages at/from the slave device are provided by the counter of the digital phase locked loop.

In this embodiment, the method may further include the steps of: initializing the counter on receipt by the slave device of the first timing message from the master device, and resetting the counter to said first master time estimate on receipt of the first master time estimate.

In an alternative embodiment, the timestamps for the time of receipt and sending of timing messages at/from the slave device are provided by a second free-running counter.

The method preferably produces the master time estimate using a recursive technique for estimating the clock offset and skew (of the slave with respect to the master). The recursive estimation technique is preferably an exponentially weighted recursive least squares method which is Kalman Filter like in structure but does not require knowledge of the measurement and process noise statistics as in the traditional Kalman Filter. An example of such a method is described in the embodiments below.

The method of the present aspect may include any combination of some, all or none of the above described preferred and optional features.

The methods of the above aspect is preferably implemented by a slave device according to the first aspect of this invention or in a system according to the third aspect of this invention, as described below, but need not be.

Further aspects of the present invention include computer programs for running on computer systems which carry out the methods of the above aspect, including some, all or none of the preferred and optional features of that aspect.

At their broadest, systems of the present invention provide for time and frequency synchronization between a master device and a slave device over a network wherein the slave device uses a phase locked loop to process an initial estimate of the time and frequency of the master clock in the slave device.

A third aspect of the present invention provides a time and frequency synchronisation system for a network, the system including: a master device having a master clock; a slave device having a slave clock; and a network connecting the master and slave devices, wherein: the slave clock comprises: a slave clock; and a digital phase locked loop including a phase detector, a loop filter, a phase accumulator and a counter, wherein: the slave device is arranged to: exchange with the master device, timing messages and to record timestamps which are: the time of sending of said timing messages from the master device according to the master clock; the time of receipt of said timing messages according to the slave clock; the time of sending of said timing messages according to the slave clock; and the time of receipt of said timing messages according to the master clock, estimate the skew and offset of the slave clock relative to the master clock from said timestamps; and synchronize said slave clock to the master clock based on the estimated skew and offset to produce a master time estimate; the digital phase locked loop processes the master time estimate as follows: on receipt of a first estimate of the master time, the counter is initialised; on receipt of subsequent estimates of the master time, the phase detector is arranged to detect a phase difference between the output of the counter and the received estimate and produce an error signal representing that difference; the error signal is filtered by the loop filter to produce a filtered error signal; the filtered error signal is used to control the frequency of the phase accumulator; and the output of the phase accumulator increments the counter and also provides a clock frequency of the slave clock which is synchronized to the frequency of the master clock.

The digital phase locked loop in the slave device can be used to attenuate the clock noise introduced by the network (which may be, for example, a packet network) to levels commensurate with the clock output requirements of the application.

Preferably the timing messages are messages under the IEEE 1588 PTP, for example, Sync, Follow_Up, Delay_Req or Delay_Response messages.

Preferably the slave device uses the output of the counter as the clock time of the slave clock which is synchronized to the time of the master clock.

The system of this aspect can therefore provide a timestamp-based clock recovery technique for end-to-end time and frequency distribution over packet networks between a master and slave device. This technique requires no assistance from the packet network and is still able to provide sub-microsecond level clock accuracies. The digital phase locked loop can provide both time and frequency signals for use at the slave (time client). Most techniques, typically, provide only one signal type, not both.

The counter output (time signal) can be subsequently formatted into various standard time signals as required.

The slave device may further comprise a direct digital synthesizer producing an analog frequency signal from the output of the phase accumulator, the direct digital synthesizer including: the phase accumulator; an oscillator; a mapping device; and a digital-to-analog converter. The slave device may further comprise a low-pass filter arranged to filter the output of the direct digital synthesizer.

The slave device may process or condition the output of the phase accumulator in other ways to provide a signal that meets the jitter requirements of the end applications in the slave device. Various forms of signals (square wave, sine wave, etc.) with interface form factors can be constructed from the phase accumulator overflow output. These signals can be conditioned by another (typically analog) phase locked loop.

In one embodiment, the counter of the digital phase locked loop is also used to provide timestamps for the time of receipt and of sending of timing messages at/from the slave device.

In this embodiment the counter may be initialized on receipt by the slave device of the first timing message from the master device, and the counter may be reset on receipt of the first master time estimate to said first master time estimate.

In an alternative embodiment, the slave device further comprises a second free-running counter, wherein the second counter is used to provide timestamps for the time of receipt and sending of timing messages at/from the slave device.

The slave device preferably produces the master time estimate using a recursive technique for estimating the clock offset and skew (of the slave with respect to the master). The recursive estimation technique is preferably an exponentially weighted recursive least squares method which is Kalman Filter like in structure but does not require knowledge of the measurement and process noise statistics as in the traditional Kalman Filter. An example of such a method is described in the embodiments below.

The system of this aspect preferably operates by carrying out a method according to the above described second aspect.

The system of the present aspect may include any combination of some, all or none of the above described preferred and optional features.

Basic Clock Model and Development of Measurement and Process Models

Figure 5:
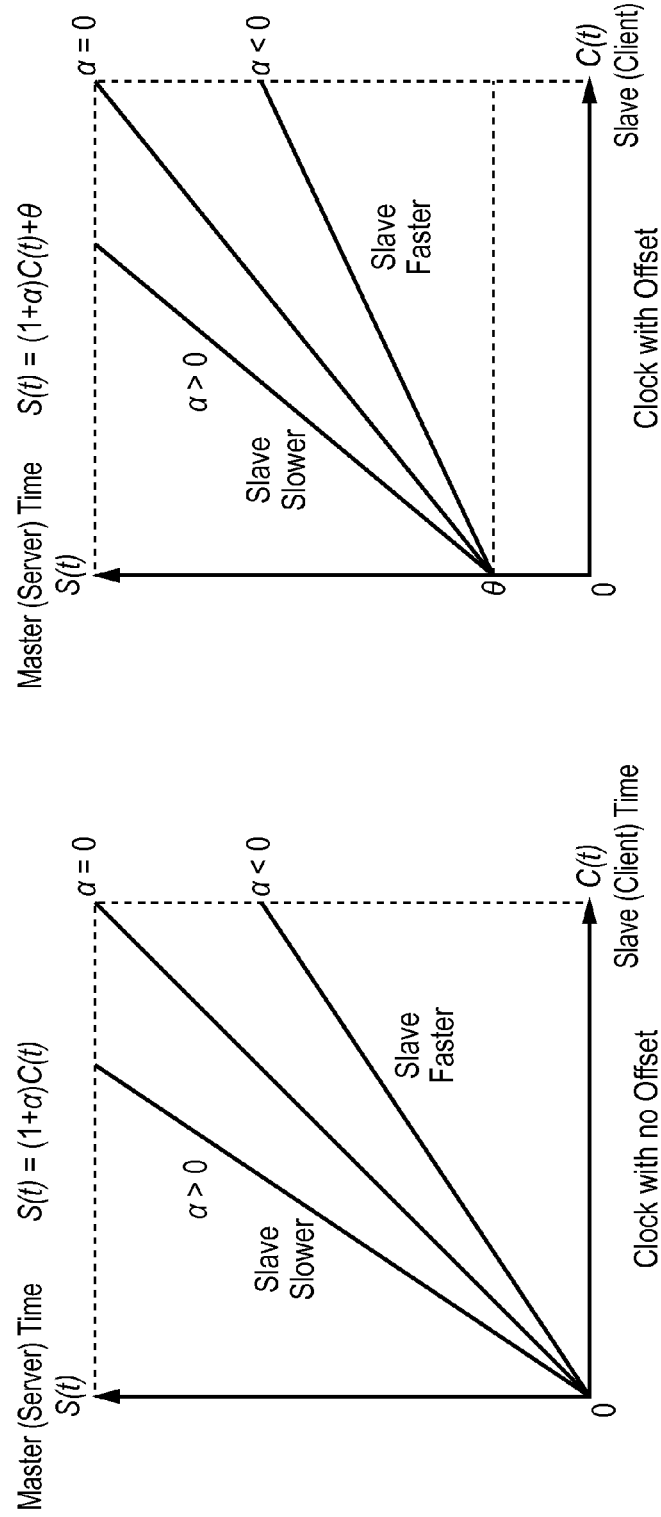
FIG. 5 shows simple models of the effect of clock skew on clocks with and without offset.

Consider the time server (master) and time client (slave) clocks, S and C, respectively. The difference or offset of the clock C relative to S at time t≥0 is $\theta(t)=(S(t)-C(t))$. t is used to denote the true time or reference (ideal) time. Frequency is the rate at which a clock progresses, and the frequency at time t of S is $S'(t)$. The skew $\alpha$ is defined as the normalized frequency difference between a clock and another clock. Generalized clock offset and skew equations can then be defined for the synchronization problem. It is assumed that at any particular time instant, the instantaneous view of the relationship between the master (server) clock with timeline S(t) and the slave (client) clock with timeline C(t), can be described by the well-know simple skew clock model depicted in FIG. 5, and described by the equation, $$S(t)=(1+\alpha)C(t)+\theta, \quad (1)$$

where the normalized $\alpha$ is a very small quantity in the order of parts-per-million. This snapshot is an instantaneous view of how well the two clocks are (mis)aligned. FIG. 5 illustrates the influence of $\theta$ and $\alpha$ on the clock alignment.

Development of Measurement (Observation) Model

The above equation can be extended to account for the case where the master clock and slave clock exchange messages over a communication link with delay. Assume that a Sync message travels from a master to a slave experiences a fixed delay d plus a variable (stochastic) delay $\epsilon$. Similarly, assume a Delay_Req message sent from the slave to the master experiences a fixed delay of d and a variable delay $\gamma$. It is further assumed that the fixed delay components in both directions are equal (symmetric communication paths) but the messages experience variables delays such queuing delays. The master and slave exchange messages using the Delay_Request Delay_Response mechanism described in FIG. 1. The system is considered to operate such that events are logged in discrete time instants n=0, 1, 2, 3, . . . , with each discrete steps is equal to a small interval (sampling) of $\Delta t$ seconds.

For the nth Sync message (FIG. 1) which departs with timestamp $T_{1,n} \in S(t)$ and arrives with timestamp $T_{2,n} \in C(t)$ after having experienced a fixed delay d and a variable delay $\epsilon_n$, the simple skew clock model above can be extended to account for the travel time $d+\epsilon_n$ to obtain the following expression $$(T_{1,n}+d+\epsilon_n)=(1+\alpha_n)T_{2,n}+\theta_n \quad (2)$$

The variables $\theta_n$ and $\alpha_n$ are the offset and skew during the nth Sync message exchange.

For the nth Delay_Req message which departs with timestamp $T_{3,n} \in C(t)$ and arrives with timestamp $T_{4,n} \in S(t)$ after having experienced a fixed delay d and a variable delay $\gamma_n$, the following expression is obtained $$T_{4,n}-d-\gamma_n=(1+\alpha_n)T_{3,n}+\theta_n \quad (3)$$

Adding (2) and (3) provides $$T_{1,n}+T_{4,n}+\epsilon_n-\gamma_n=(1+\alpha_n)(T_{2,n}+T_{3,n})+2\theta_n$$

$$(T_{1,n}-T_{2,n})+(T_{4,n}-T_{3,n})=2\theta_n+\alpha_n(T_{2,n}+T_{3,n})+(\gamma_n-\epsilon_n) \quad (4)$$

The expression above is a measurement (observation) equation of the form $$y_n=\overline{D}_n^T \overline{X}_n+v_n \quad (5)$$

where n is a nonnegative time index, $y_n=(T_{1,n}-T_{2,n})+(T_{4,n}-T_{3,n})$ is a scalar, $\overline{D}_n=[2(T_{2,n}+T_{3,n})]^T$ is a vector, $\overline{X}_n^T=[\theta_n \, \alpha_n]$ is a vector, $v_n=(\gamma_n-\epsilon_n)$ is the measurement noise and T denotes transpose. Filtering techniques such as the Kalman Filter assume $v_n$ to be white noise with zero mean and variance $\sigma_{v,n}^2$. The nth sampling interval is considered to be the period in which the nth Sync and nth Delay_Req messages exchanges occur. This measurement equation relates all the necessary protocol (measurement) variables ($\{T_{1,n},T_{4,n}\} \in S(t)$ and $\{T_{2,n},T_{3,n}\} \in C(t)$) to the clock variables ($\theta_n$ and $\alpha_n$) plus measurement noise $v_n=(\gamma_n-\epsilon_n)$.

The clock offset can be expressed from (4) as follows $$\theta_n = -\left[\frac{(T_{2,n}-T_{1,n})-(T_{4,n}-T_{3,n})}{2}\right] - \frac{\alpha_n(T_{2,n}+T_{3,n})}{2} - \frac{(\gamma_n-\epsilon_n)}{2} \quad (6)$$

It can be seen from this equation that for a system with zero skew and no noise, the clock offset simplifies to the classic offset equation $$\theta_n = -\left[\frac{(T_{2,n}-T_{1,n})-(T_{4,n}-T_{3,n})}{2}\right] \quad (7)$$

The above equation can be derived without the minus sign when the clock model $C(t)=(1+\alpha)S(t)+\theta$ is used instead. Either way, the same classic offset equation can be derived.
Developing the State (Process) Equation—Clock Process Model Typically, the clock deviation of a clock is modeled by the following random differential equation $$\frac{dX(t)}{dt} = FX(t) + \xi(t), \quad (8)$$

where F is an L×L real matrix and X(t) is the state vector $$X(t) = \begin{bmatrix} x_1(t) \\ \vdots \\ x_L(t) \end{bmatrix}. \quad (9)$$

The quantity $x_1(t)=\theta(t)$ represents the time deviation (or time offset), $x_2(t)=\alpha(t)$ is the clock frequency deviation, and $x_3(t)=\alpha(t)$ represents the so-called frequency drift or aging. In the model, $\xi(t)$ is the vector of statistically independent zero-mean white Gaussian noises, $$\xi(t) = \begin{bmatrix} \xi_1(t) \\ \vdots \\ \xi_L(t) \end{bmatrix}, \quad (10)$$

with each element of the vector having autocorrelation $$E[\xi_k(t_1)\xi_k(t_2)]=g_k\delta(t_1-t_2),$$

for k=1, 2, . . . , L and where $\delta(t)$ is the Dirac delta function. The autocorrelation matrix of $\xi(t)$ is thus $$E[\xi(t_1)\xi^T(t_2)]=G\delta(t_1-t_2), \quad (12)$$

and where G is the diagonal matrix $$G = \begin{bmatrix} g_1 & \cdots & 0 \\ \vdots & \ddots & \vdots \\ 0 & \cdots & g_L \end{bmatrix}. \quad (13)$$

The random differential (8) can be written in the integral form $$X(t)=\Phi(t-t_0)X(t_0)+\int_{t_0}^{t}\Phi(t-\tau)\xi(\tau)d\tau, \quad (14)$$

where $t_0$ is the initial time and $\Phi(t)$ is the transition matrix $$\Phi(t)=e^{Ft}. \quad (15)$$

The time axis can be discretized with a sampling time $\Delta t$ so that t takes the values $t_n=n\Delta t$, where n=0, 1, 2, . . . . The integral form of (14) in discrete time becomes $$X(t_n)=\Phi(\Delta t)X(t_{n-1})+w(t_{n-1})$$

$$\Rightarrow \overline{X}_n=\overline{A}\overline{X}_{n-1}+\overline{w}_n \quad (16)$$

where $$w(t_{n-1})=\int_{t_{n-1}}^{t_n}\Phi(t-\tau)\xi(\tau)d\tau, \quad (17)$$

is a Gaussian random variable whose mean is zero and whose covariance matrix is $$Q_{n-1} = Q(t_{n-1}) \quad (18)$$

$$= E[(w(t_{n-1})-E[w(t_{n-1})])(w(t_{n-1})-E[w(t_{n-1})])^T]$$

$$= \int_{t_{n-1}}^{t_n}\int_{t_{n-1}}^{t_n} \Phi(t_n-\tau)E[\xi(\tau)\xi^T(s)]\Phi^T(t_n-s)\,ds\,d\tau$$

$$= \int_{t_{n-1}}^{t_n}\int_{t_{n-1}}^{t_n} \Phi(t_n-\tau)G\delta(s-\tau)\Phi^T(t_n-s)\,ds\,d\tau$$

$$= \int_{t_{n-1}}^{t_n} \Phi(t_n-\tau)G\Phi^T(t_n-\tau)\,d\tau$$

For L=2, it is noted that the matrix A in our clock process model (16) is $$\overline{A} \approx \Phi(\Delta t) = I + F\Delta t = \begin{bmatrix} 1 & \Delta t \\ 0 & 1 \end{bmatrix}, \quad (19)$$

$$F = \begin{bmatrix} 0 & 1 \\ 0 & 0 \end{bmatrix},$$

which an approximation of a power series expansion of (15), which is $$\Phi(t) = e^{Ft} = I + F(t) + F^2\frac{t^2}{2} + F^3\frac{t^2}{6} + \ldots + F^{q-1}\frac{t^{q-1}}{(q-1)!}, \quad (20)$$

where I is the identity matrix. The system can be described by the following two-state dynamic model $$\overline{X}_n = \begin{bmatrix} \theta_n \\ \alpha_n \end{bmatrix} = \begin{bmatrix} 1 & \Delta t \\ 0 & 1 \end{bmatrix}\begin{bmatrix} \theta_{n-1} \\ \alpha_{n-1} \end{bmatrix} + \begin{bmatrix} w_{\theta,n} \\ w_{\alpha,n} \end{bmatrix} = \overline{A}\overline{X}_{n-1} + \overline{w}_n, \quad (21)$$

where $A_n$ is the known 2-by-2 state transition matrix and $\overline{w}_n$ is an 2-dimensional zero mean white process noise vector. If the time between Sync messages is fixed and is taken as the sampling interval, then we have $\Delta T_n = (T_{1,n} - T_{1,n-1}) = \Delta t$.

The variance of the process noise $\overline{w}_n$ is related to the oscillator of local PLL at the slave. For the Telecom clock synchronization problem, the local oscillator is typically a Temperature Compensated Crystal Oscillator (TCXO) or Oven Controlled Crystal Oscillator (OCXO). Practical implementation of filtering techniques such as the Kalman Filter require getting a good estimate of the variance of measurement noise ($v_n = (\gamma_n - \epsilon_n)$) and covariance of the process noise vector ($\overline{w}_n$). The exponentially weighted recursive least squares (RLS) technique [4] of the embodiment described below (which has a Kalman Filter-like structure) requires no such noise variance estimates but yields accurate clock parameter estimates like the Kalman Filter with known noise statistics.

Exponentially Weighted Recursive Least Squares (RLS) Method—a Kalman Filter-Like Algorithm The model used in this embodiment is based on state-space representations of the variables being estimated. The state-space formulation implies that, at each point in time, the process being modeled is described by a vector of state variables that summarize all relevant quantities of interest. The filtering algorithm to be described below uses this model of the time behavior of the system along with noisy observations or measurements of some system variables to produce optimal estimates of all state variables. These estimates are then used in the process model to determine state estimates for future time periods.

Consider a state-space model described by the following pair of equations (i.e., clock measurement and state equations, respectively), $$y_n = \overline{D}_n^T \overline{X}_n + v_n,$$

$$\overline{X}_{n+1} = \overline{A}_n \overline{X}_n + \overline{w}_n,$$

where n is a nonnegative time index, $\overline{A}_n$ is a known M-by-M state transition matrix, $\overline{X}_n$ is the M-dimensional state (or parameter) vector, $\overline{w}_n$ is an M-dimensional zero mean white process noise vector, $y_n$ is the measurement, $\overline{D}_n$ is a known M-dimensional measurement vector, $v_n$ is white noise with zero mean and variance $\sigma_{v,n}^2$, and T denotes transpose. The measurements $y_{n-i}$, $0 \le i \le n$, can be expressed in terms of $\overline{X}_n$. From the state equation (16), $\overline{X}_{n-i}$ can be written as $$\overline{X}_{n-i} = \left(\prod_{j=n-i}^{n-1}\overline{A}_j^{-1}\right)\overline{X}_n - \sum_{m=1}^{i}\left(\prod_{j=n-i}^{n-m}\overline{A}_j^{-1}\right)\overline{w}_{n-m} \quad (22)$$

$$= \Psi_n^{n-i}\overline{X}_n - \sum_{m=1}^{i}\Psi_{n-m+1}^{n-i}\overline{w}_{n-m}$$

where $$\Psi_a^b = \prod_{l=b}^{a-1}A_l^{-1}, \ a > b \quad (23)$$

is the backward transition matrix relating the states $\overline{X}_a$ and $\overline{X}_b$. Using (22) in (5), we get $$y_{n-i} = \overline{D}_{n-i}^T \Psi_n^{n-i}\overline{X}_n - \overline{D}_{n-i}^T\left(\sum_{m=1}^{i}\Psi_{n-m+1}^{n-i}\overline{w}_{n-m}\right) + v_{n-i}. \quad (24)$$

If we define the (n+1)-by-M matrix $$\overline{H}_n = [\overline{D}_n, (\overline{D}_{n-1}^T\Psi_n^{n-1})^T, (\overline{D}_{n-2}^T\Psi_n^{n-2})^T, \ldots, (\overline{D}_0^T\Psi_n^0)^T]^T, \quad (25)$$

and the (n+1)-dimensional vector $$\overline{u}_n = -\left[0, (\overline{D}_{n-1}^T\Psi_n^{n-1}\overline{w}_{n-1})^T,\right.$$

$$\left.\left(\overline{D}_{n-2}^T\sum_{m=1}^{2}\Psi_{n-m+1}^{n-2}\overline{w}_{n-m}\right)^T, \ldots, \left(\overline{D}_0^T\sum_{m=1}^{2}\Psi_{n-m+1}^{0}\overline{w}_{n-m}\right)^T\right]^T, \quad (26)$$

then the set of measurements $\{y_n, y_{n-1}, \ldots, y_0\}$ can be expressed as $$\overline{Y}_n = \overline{H}_n\overline{X}_n + \overline{n}_n, \quad (27)$$

where $\overline{Y}_n = [y_n, y_{n-1}, \ldots, y_0]^T$, $\overline{n}_n = \overline{u}_n + \overline{v}_n$ (which has zero mean) and $\overline{v}_n = [v_n, v_{n-1}, \ldots, v_0]^T$.

Consider $\overline{X}$ to be an M-dimensional vector to be estimated. In least-square (LS) estimation, the problem is to find an estimate $\hat{X}$ of the vector $\overline{X}$ as a linear combination of the measurements $\overline{Y}$ so that the estimate $\hat{X}$ minimizes the following cost function:

$$J(\hat{X}) = (\overline{Y} - \overline{H}\hat{X})^T\overline{W}(\overline{Y} - \overline{H}\hat{X}), \quad (28)$$

where $\overline{W}$ is an M-by-M weight matrix. The solution to this problem, $\partial J/\partial \hat{X} = 0$, can be expressed as $$\hat{X} = (\overline{H}^T\overline{W}\overline{H})^{-1}\overline{H}^T\overline{W}\overline{Y}, \quad (29)$$

which is an unbiased estimate of $\overline{X}$. The matrix $\overline{W}$ can be set equal to the diagonal matrix $$\overline{W} = \text{diag}[1, \lambda, \lambda^2, \ldots, \lambda^{M-1}], \quad (30)$$

where $0 < \lambda \le 1$ and $\lambda^n (0 \le n \le M-1)$ represents the (n+1)-th diagonal element. This results in the cost function (28) becoming $$J(\hat{X}) = \sum_{n=0}^{M-1}\lambda^{M-1-n}(y_n - \overline{D}_n^T\hat{X})^2, \quad (31)$$

where $y_n$ is the (M−n)-th element of $\overline{Y}$ and $\overline{D}_n^T$ is the (M−n)-th row of $\overline{H}$. This cost function leads to the exponentially weighted RLS algorithm with forgetting factor $\lambda$.

Using (29) the state vector $\overline{X}$ can be estimated as $$\hat{X}_{n,n} = (\overline{H}_n^T \overline{W}_n \overline{H}_n)^{-1} \overline{H}_n^T \overline{W}_n \overline{Y}_n = \overline{P}_{n,n} \overline{H}_n^T \overline{W}_n \overline{Y}_n, \quad (32)$$

where $\hat{X}_{n,n}$ denotes an estimate of $\overline{X}$ based on data up to time n, $\overline{W}_n$ is a (n+1)-by-(n+1) weight matrix, and $\overline{P}_{n,n} = (\overline{H}_n^T \overline{W}_n \overline{H}_n)^{-1}$. The matrix $\overline{P}_{n,n}$ is not a covariance matrix, unlike the case of Kalman filtering. The matrix $\overline{W}_n$ can be expressed as $$\overline{W}_n = \mathrm{diag}\left[1, \lambda_n, \prod_{m=1}^{2} \lambda_{n-m+1}, \cdots, \prod_{m=1}^{n} \lambda_{n-m+1}\right]. \quad (33)$$

When $\lambda_1 = \lambda_2 = \ldots = \lambda_n = \lambda$, the weight becomes identical to (30).

To reduce the amount of calculations for $\hat{X}_{n,n}$ in (32), a recursive version needs to be developed. Substituting $\overline{X}_{n-1} = \overline{A}_{n-1}^{-1} \overline{X}_n - \overline{A}_{n-1}^{-1} \overline{w}_{n-1}$ from (16) into $\overline{Y}_{n-1}$ in (27), gives $$\overline{Y}_{n-1} = \overline{H}_{n-1} \overline{X}_{n-1} + \overline{n}_{n-1} \quad (34)$$
$$= \overline{H}_{n-1} \overline{A}_{n-1}^{-1} \overline{X}_n - \overline{H}_{n-1} \overline{A}_{n-1}^{-1} \overline{w}_{n-1} + \overline{n}_{n-1}$$
$$= \overline{H}_{n,n-1} \overline{X}_n + \overline{n}_{n,n-1}$$

where $\overline{H}_{n,n-1} = \overline{H}_{n-1} \overline{A}_{n-1}^{-1}$ and $\overline{n}_{n,n-1} = \overline{n}_{n-1} - \overline{H}_{n,n-1} \overline{w}_{n-1}$. The one-step prediction of $X_n$ given $\{y_0, y_1, \ldots, y_{n-1}\}$ can be expressed as $$\hat{X}_{n,n-1} = (\overline{H}_{n,n-1}^T \overline{W}_{n,n-1} \overline{H}_{n,n-1})^{-1} \overline{H}_{n,n-1}^T \overline{W}_{n,n-1} \overline{Y}_{n-1} = \overline{P}_{n,n-1} \overline{H}_{n,n-1}^T \overline{W}_{n,n-1} \overline{Y}_{n-1} \quad (35)$$

where $$\overline{P}_{n,n-1} = (\overline{H}_{n,n-1}^T \overline{W}_{n,n-1} \overline{H}_{n,n-1})^{-1}, \quad (36)$$

and $\overline{W}_{n,n-1}$ is a weight matrix. A reasonable choice for the matrix $\overline{W}_{n,n-1}$ for the one-step prediction is $$\overline{W}_{n,n-1} = \lambda_n \overline{W}_{n-1}. \quad (37)$$

With this weight matrix, every input including the most recent one $y_{n-1}$ can be properly weighted for one-step prediction. The goal here is to express $\hat{X}_{n,n}$ in terms of $\hat{X}_{n,n-1}$ and $\hat{X}_{n-1,n-1}$. Substituting (37) into (36), and making use of the relations $\overline{H}_{n,n-1} = \overline{H}_{n-1} \overline{A}_{n-1}^{-1}$ and $(\overline{A}_{n-1}^{-1})^T = (\overline{A}_{n-1}^T)^{-1}$ gives $$\overline{P}_{n,n-1} = \frac{\left[\overline{H}_{n,n-1}^T \overline{W}_{n-1} \overline{H}_{n,n-1}\right]^{-1}}{\lambda_n}$$
$$= \frac{\left[(\overline{A}_{n-1}^{-1})^T \overline{H}_{n-1}^T \overline{W}_{n-1} \overline{H}_{n-1} \overline{A}_{n-1}^{-1}\right]^{-1}}{\lambda_n}$$
$$= \frac{\left[(\overline{A}_{n-1}^T)^{-1} \overline{P}_{n-1,n-1}^{-1} \overline{A}_{n-1}^{-1}\right]^{-1}}{\lambda_n}$$

Using the relation $(abc)^{-1} = c^{-1} b^{-1} a^{-1}$ in the above result gives $$\overline{P}_{n,n-1} = \frac{\overline{A}_{n-1} \overline{P}_{n-1,n-1} \overline{A}_{n-1}^T}{\lambda_n}. \quad (38)$$

Substituting (38) in (35) and using the relations $\overline{H}_{n-1} = \overline{H}_{n,n-1} \overline{A}_{n-1}$, the following is obtained $$\hat{X}_{n,n-1} = \left(\frac{\overline{A}_{n-1} \overline{P}_{n-1,n-1} \overline{A}_{n-1}^T}{\lambda_n}\right) \overline{H}_{n,n-1}^T \overline{W}_{n,n-1} \overline{Y}_{n-1}$$
$$= \overline{A}_{n-1} \overline{P}_{n-1,n-1} (\overline{H}_{n,n-1} \overline{A}_{n-1})^T \frac{\overline{W}_{n,n-1}}{\lambda_n} \overline{Y}_{n-1}$$
$$= \overline{A}_{n-1} \left(\overline{P}_{n-1,n-1} \overline{H}_{n-1}^T \overline{W}_{n-1} \overline{Y}_{n-1}\right)$$

Using (32) in the above results gives $$\hat{X}_{n,n-1} = \overline{A}_{n-1} \hat{X}_{n-1,n-1}, \quad (39)$$

Exploiting the following relations $$\overline{H}_n = \begin{bmatrix} \overline{D}_n^T \\ \overline{H}_{n,n-1} \end{bmatrix}, \quad \overline{W}_n = \begin{bmatrix} 1 & 0 \\ 0 & \overline{W}_{n,n-1} \end{bmatrix}, \quad \overline{Y}_n = \begin{bmatrix} y_n & \overline{Y}_{n-1}^T \end{bmatrix}^T, \quad (40)$$

the recursions for $\overline{P}_{n,n}$ and $\hat{X}_{n,n}$ can be derived. From the matrix $\overline{P}_{n,n}$ in (32), $$\overline{P}_{n,n} = \left(\begin{bmatrix} \overline{D}_n & \overline{H}_{n,n-1}^T \end{bmatrix} \begin{bmatrix} 1 & 0 \\ 0 & \overline{W}_{n,n-1} \end{bmatrix} \begin{bmatrix} \overline{D}_n^T \\ \overline{H}_{n,n-1} \end{bmatrix}\right)^{-1}$$
$$= (\overline{H}_{n,n-1}^T \overline{W}_{n,n-1} \overline{H}_{n,n-1} + \overline{D}_n \overline{D}_n^T)^{-1}$$

Applying the matrix inversion lemma $(a+bcd)^{-1} = a^{-1} - a^{-1} b (da^{-1} b + c^{-1})^{-1} d a^{-1}$ to the above, gives $$\overline{P}_{n,n} = \overline{P}_{n,n-1} - \frac{\overline{P}_{n,n-1} \overline{D}_n \overline{D}_n^T \overline{P}_{n,n-1}}{\overline{D}_n^T \overline{P}_{n,n-1} \overline{D}_n + 1}. \quad (41)$$

Now the desired estimate $\hat{X}_{n,n}$ becomes $$\hat{X}_{n,n} = \overline{P}_{n,n} \overline{H}_n^T \overline{W}_n \overline{Y}_n$$
$$= \overline{P}_{n,n} \left(\begin{bmatrix} \overline{D}_n & \overline{H}_{n,n-1}^T \end{bmatrix} \begin{bmatrix} 1 & 0 \\ 0 & \overline{W}_{n,n-1} \end{bmatrix} \begin{bmatrix} y_n \\ \overline{Y}_{n-1} \end{bmatrix}\right)$$
$$= \left(\overline{P}_{n,n-1} - \frac{\overline{P}_{n,n-1} \overline{D}_n \overline{D}_n^T \overline{P}_{n,n-1}}{\overline{D}_n^T \overline{P}_{n,n-1} \overline{D}_n + 1}\right) \left(\overline{H}_{n,n-1}^T \overline{W}_{n,n-1} \overline{Y}_{n-1} + \overline{D}_n y_n\right)$$

which after some manipulations reduces to $$\hat{X}_{n,n} = \hat{X}_{n,n-1} + \overline{K}_n (y_n - \overline{D}_n^T \hat{X}_{n,n-1}), \quad (42)$$

where $$\overline{K}_n = \frac{\overline{P}_{n,n-1} \overline{D}_n}{\overline{D}_n^T \overline{P}_{n,n-1} \overline{D}_n + 1}, \quad (43)$$

is the Kalman gain vector. Eq. (41) can further be expressed in terms of $\overline{K}_n$ as $$\overline{P}_{n,n} = (\overline{I} - \overline{K}_n \overline{D}_n^T) \overline{P}_{n,n-1}, \quad (44)$$

where $\overline{I}$ is the identity matrix. Equations (38), (39), (41), (42), and (43) constitute the RLS algorithm which is summarized in the steps below:

1. Initialize algorithm by setting $\hat{X}_{0,-1} = \overline{0}$ $\overline{P}_{0,-1} = \gamma^{-1}\overline{I}$, $\gamma$ is a small positive constant $n=1$ 2. State prediction:

$\hat{X}_{n,n-1} = \overline{A}_{n-1}\hat{X}_{n-1,n-1}$

3. Calculate $$\overline{P}_{n,n-1} = \frac{\overline{A}_{n-1}\overline{P}_{n-1,n-1}\overline{A}_{n-1}^T}{\lambda_n}$$

4. Calculate Kalman gain vector $$\overline{K}_n = \frac{\overline{P}_{n,n-1}\overline{D}_n}{\overline{D}_n^T\overline{P}_{n,n-1}\overline{D}_n + 1}$$

5. Update state estimate:

$\hat{X}_{n,n} = \hat{X}_{n,n-1} + \overline{K}_n(y_n - \overline{D}_n^T\hat{X}_{n,n-1})$ 6. Calculate $\overline{P}_{n,n} = (\overline{I} - \overline{K}_n\overline{D}_n^T)\overline{P}_{n,n-1}$ $n=n+1$ 7. go to step 2

For the present clock synchronization problem, the initialization factor $\gamma$ is selected to be a small positive constant in the order of parts-per-million (e.g., $\gamma=10^{-6}$). The forgetting factor $\lambda_n$ is a suitable constant (e.g., $\lambda_n=0.9999$) or can be made dynamic.

Proposed DPLL Architecture for Time and Frequency Recovery

Figure 6:
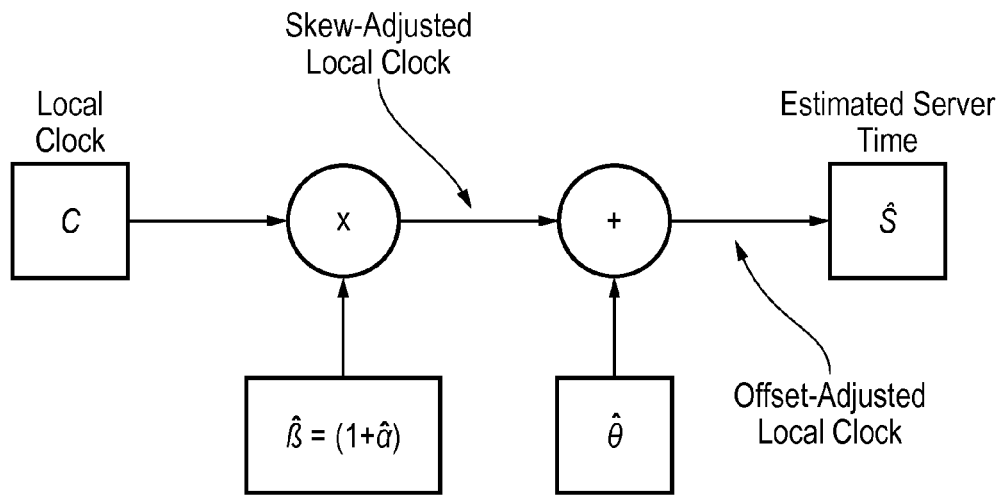
FIG. 6 shows the calculation process for the estimation sever time at a PTP slave device.
Figure 7:
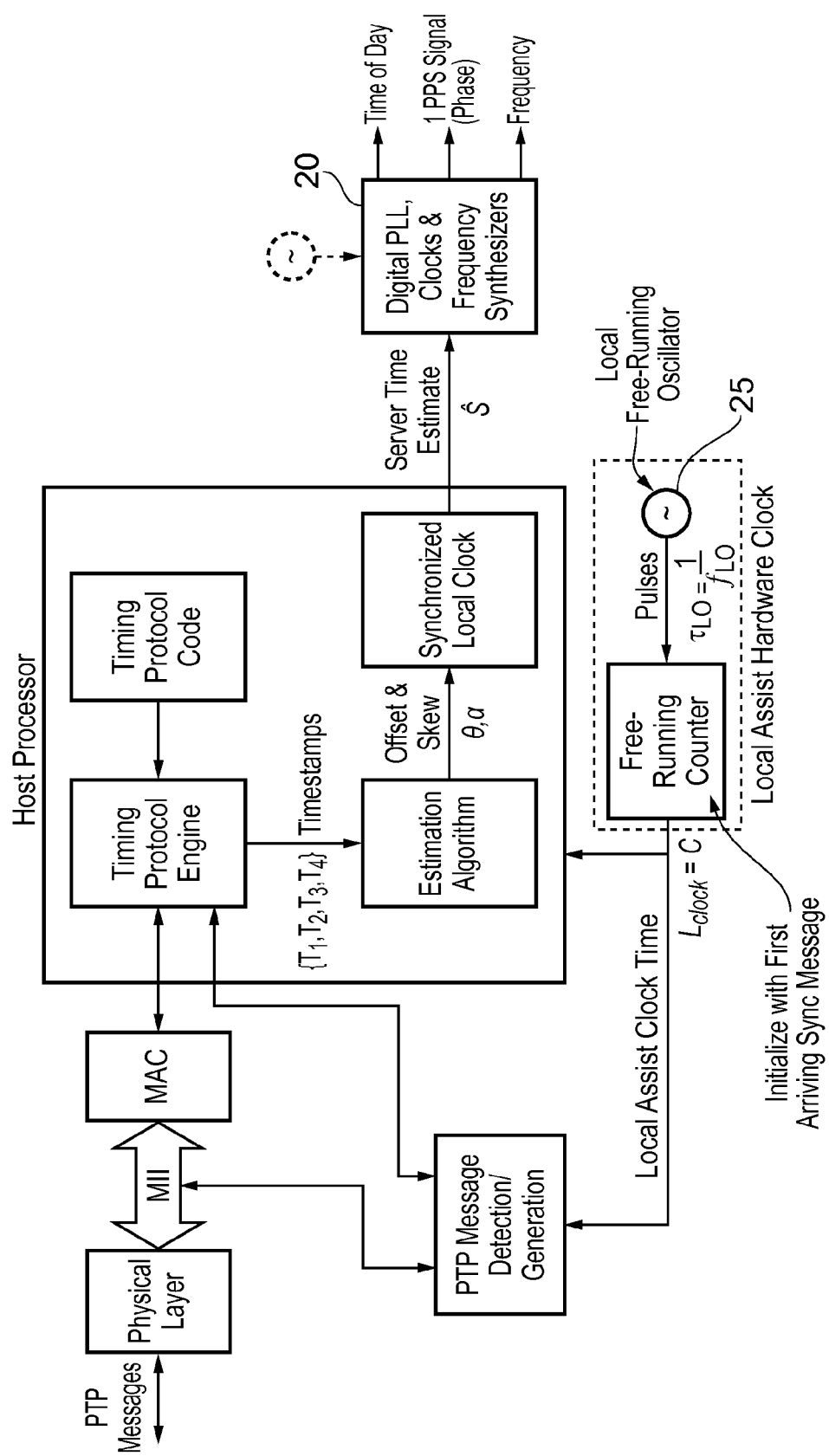
FIG. 7 shows the architecture of a slave device according to an embodiment of the present invention.

The clock offset ($\hat{\delta}$) and skew ($\hat{\alpha}$) can be estimated by the client after each Sync message broadcast by the server or after multiple periods of the Sync message broadcast. The period between Sync messages could serve as sampling period of the system. The server time $\hat{S}$ can be computed using the local clock C of the client as adjusted for skew and offset as illustrated in FIG. 6. FIG. 7 shows the main blocks of the proposed synchronization mechanism at the time client. A free running local client oscillator 25 is used together with the estimated clock offset and skew to derive the server clock estimate $\hat{S}$.

Figure 9:
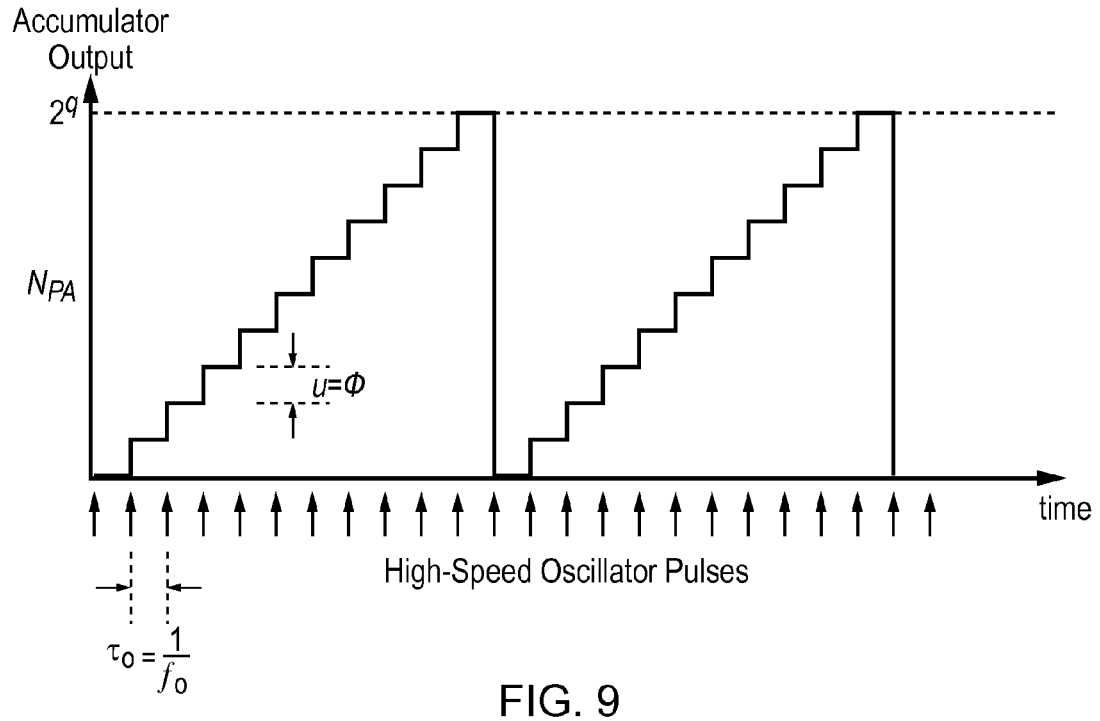
FIG. 9 shows the output of the phase accumulator in FIG. 8.
Figure 8:
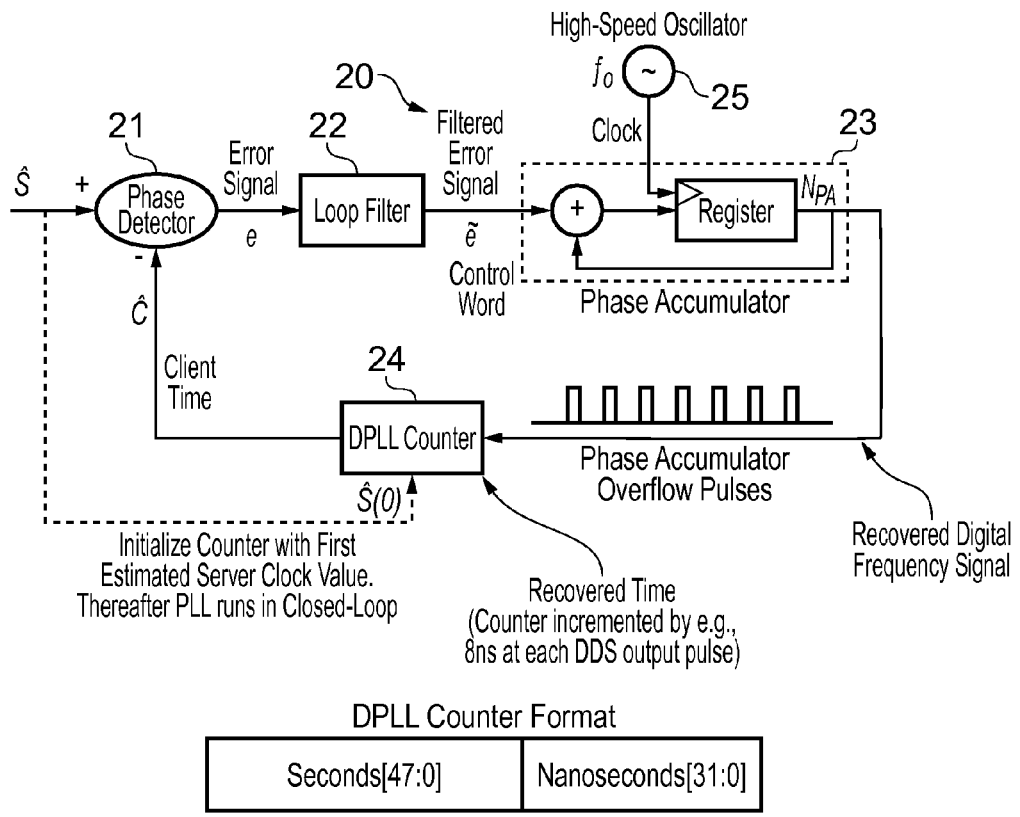
FIG. 8 shows the operation of a digital phase locked loop (DPLL) based on a phase accumulator.

The principal purpose of the architecture shown in FIG. 7 is to reconstruct an accurate estimate of both the server time and frequency at the slave. This is done using a Digital Phase Locked Loop (DPLL) 20 that employs a phase accumulator 23, a loop filter 22, a phase detector 21, and a counter 24 as shown in FIG. 8. The local assist hardware clock 25 (with free-running counter) is used only for timestamping PTP messages. The free-running counter can be initialized with first arriving Sync message at the slave. The DPLL 20 is controlled in such a way that the overflow pulses of the phase accumulator 23 drive the counter 24 as shown in FIG. 9. In the locked mode, the DPLL counter 24 generates a continuous server time signal while the phase accumulator overflow pulses generate a server frequency signal.

At startup, the DPLL 20 waits for the first computed server time estimate ($\hat{S}(0)$). This first server time estimate is used to initialize the DPLL counter ($\hat{C}(0) = \hat{S}(0)$). From this point onwards and upon the receipt of subsequent server time estimates ($\hat{S}(n)$) at any discrete time instant n, the DPLL 20 starts to operate in a closed-loop fashion. At each server time estimate ($\hat{S}(n)$), the DPLL counter reading is noted by the slave ($\hat{C}(n)$). Then the difference between the computed server time estimate ($\hat{S}(n)$) and the DPLL counter reading ($\hat{C}(n)$) gives an error signal ($e(n) = \hat{S}(n) - \hat{C}(n)$). This error signal ($e(n)$) is sent to the loop filter 21 whose output controls the frequency of the phase accumulator 23. The output (overflow pulses) of the phase accumulator 23 in turn provides the clock frequency of the slave and also drives the DPLL counter 24. After a while the error term is expected to converge to zero which means the DPLL 20 has been locked to the incoming master time base (in both frequency and time).

Figure 10:
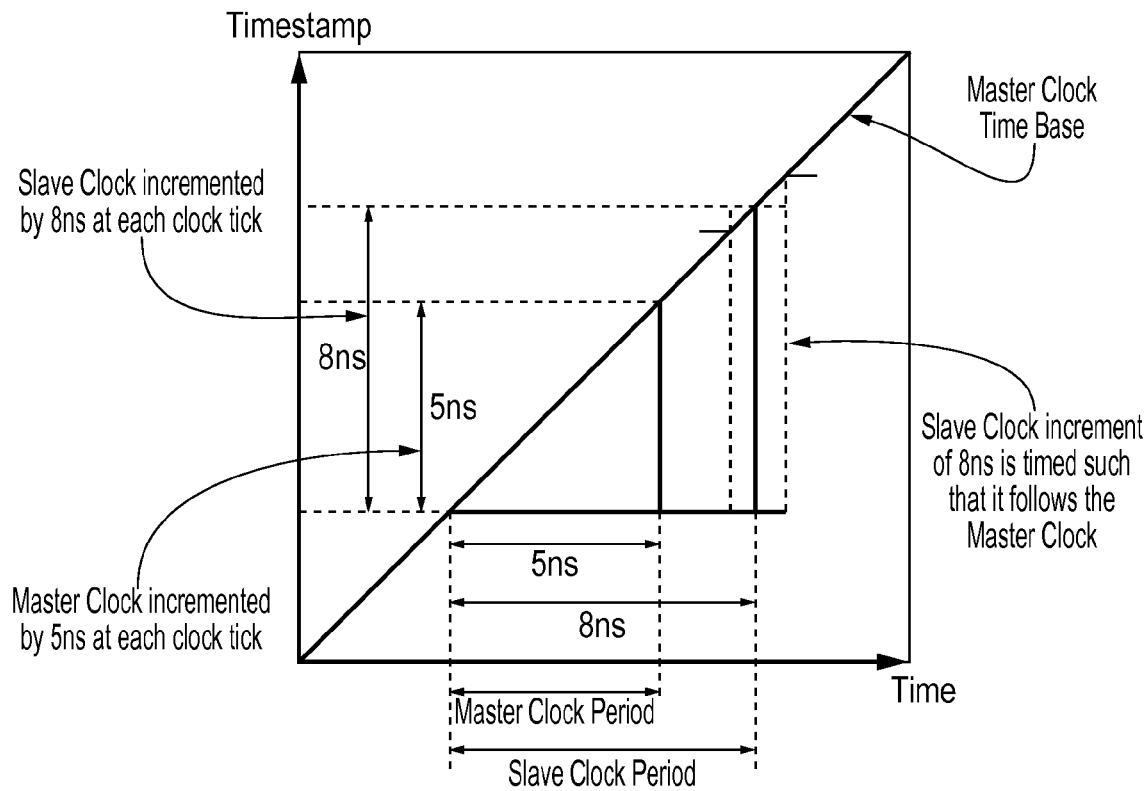
FIG. 10 illustrates the synchronization between a master and a slave following synchronization using a DPLL.

As shown in FIG. 8, at each phase accumulator overflow (output) pulse, the DPLL counter 24 is incremented by the nominal period of the phase accumulator overflow pulse (e.g., 8 ns for a 125 MHz nominal phase accumulator overflow output frequency). The DPLL 20 is controlled in such a way that the DPLL counter evolution follows the computed server time estimate as illustrated in FIG. 10. As illustrated in FIG. 10, the timing of the increment (controlled by the phase accumulator overflow input word) is controlled such that the increment falls along the master clock time base. With correct controlled timing of the counter increments, the DPLL 20 provides both a frequency signal (output of phase accumulator 23 overflow) and time signal (output of DPLL counter 24).

Figure 11:
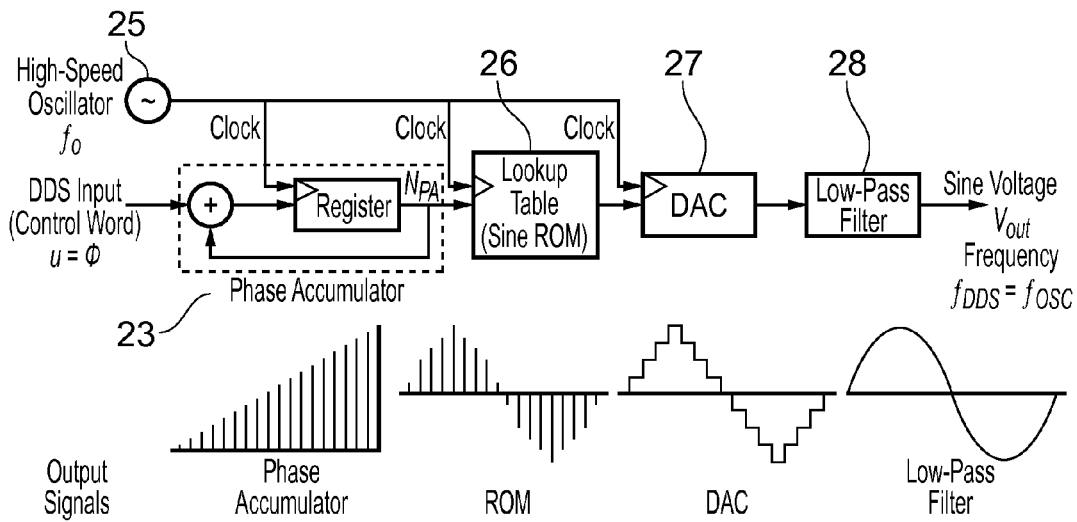
FIG. 11 shows a direct digital synthesizer (DDS) which is used in an embodiment of the present invention.
Figure 12:
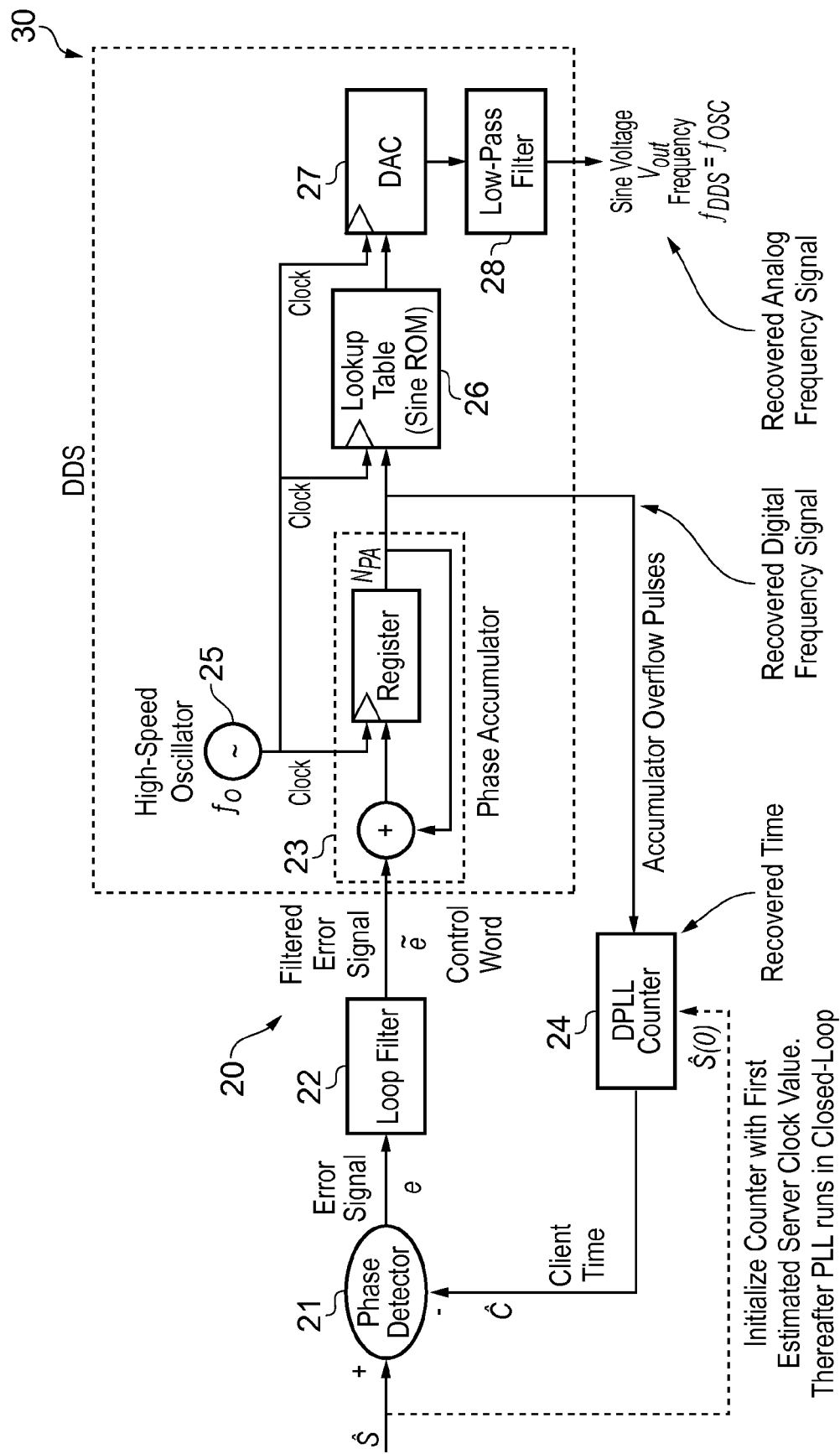
FIG. 12 shows a DPLL operating in a slave device according to an embodiment of the present invention with time and frequency outputs.

The frequency signal can then be conditioned using other techniques as shown in FIGS. 11 and 12 to provide a signal that meets the jitter requirements of the end applications. Various forms of signals (square wave, sine wave, etc.) with interface form factors can be constructed from the phase accumulator overflow output. The signals can be conditioned by another analog PLL (APLL) for use by the end application. The DPLL counter output (time signal) can also be formatted into various time standard signals.

The architecture shown in FIGS. 7 and 8 can be implemented with either two separate counters (free-running counter and DPLL counter) or one counter (DPLL counter only). Both architectures can be used to synthesize both time and frequency signals:

Architecture with separate counters (free-running counter 25 and DPLL counter 24): The initialization of these counters is done as follows:

Free-Running Counter: This counter is used only for timestamping PTP messages. It can be initialized with first arriving Sync message at the slave. Its initial value can also be user configured.

DPLL Counter: This counter provides a continuous time signal for the slave locked to master. It is initialized with the first computed server time estimate by the slave.

Architecture with one counter (DPLL counter 24 only): In this configuration, the DPLL counter serves both as a timestamping counter as well as a counter that provides a continuous time signal for the slave. Initialization is carried out as follows:

The DPLL starts in open-loop mode. The DPLL counter is initialized with first arriving Sync message. This can also be a user configured initial value.

DPLL still running in open-loop but DPLL counter driven by phase accumulator overflow pulses. DPLL counter readings now used to timestamp subsequent PTP messages.

First server time estimate is computed and DPLL counter reset to this first time estimate. DPLL now moves into closed-loop mode. DPLL counter readings used to timestamp subsequent PTP messages.

Subsequent server time estimates used as DPLL reference signal. DPLL continuous to operate in closed-loop mode.

The phase accumulator 23 is a variable-modulus counter that increments the number stored in it each time it receives a clock pulse. When the counter overflows it wraps around, making the phase accumulator's output contiguous. The larger the added increment $\phi$, the faster the accumulator overflows, which results in a higher output frequency. The output frequency $f_{DDS}$ of the phase accumulator is a function of the system clock frequency $f_o$, the number of bits q in the phase accumulator and the phase increment value $\phi$. The phase increment $\phi$ is an unsigned value.

$$f_{DDS} = \frac{f_o}{2^q} \phi \qquad (45)$$

From this equation it can be seen that the frequency resolution of the phase accumulator is $f_{res}=f_o/2^q$. Assuming that the phase accumulator is operating with a control input $\phi_{nom}$ which corresponds to the nominal frequency $f_{DDS}=f_{nom}$, it will be seen from the above discussion that, adding a quantity $-\phi_{corr}$ to $\phi_{nom}$ (i.e., $\phi_{DDS}=\phi_{nom}-\phi_{corr}$) results in a decrease in the output frequency, $f_{DDS}=f_{nom}-\Delta f$, whereas adding a quantity $+\phi_{corr}$ to $\phi_{nom}$ (i.e., $\phi_{DDS}=\phi_{nom}+\phi_{corr}$) results in an increase in the output frequency, $f_{DDS}=f_{nom}+\Delta f$. Thus, by appropriately controlling the quantity $\phi_{corr}$ added to $\phi_{nom}$ the output frequency of the phase accumulator $f_{DDS}$ can be controlled accordingly.

The phase accumulator 23 can be employed, if needed, as part of a Direct Digital Synthesizer (DDS) 30 from which an analog signal can be generated as shown in FIGS. 11 and 12. Though there are many variations, the conventional DDS architecture can be viewed as a simple assembly comprised of only three common digital components: a phase accumulator 23 (or adder/accumulator), a mapping device 26 (such as a read-only-memory (ROM) or random-access memory (RAM)), and a digital-to-analog converter (DAC) 27. In many cases a low-pass filter 28 is implemented at the output of the DAC but this component is not normally considered a part of the DDS. The reference clock $f_o$ must operate at higher frequency than the synthesized clock because of Nyquist theorem.

DPLL Loop Filter Parameters

In order to analyze and design a control system, it is necessary to obtain a quantitative mathematical description or model of the system. The model is a set of mathematical relationships among the system variables. Because the system under consideration is dynamic in nature, the descriptive equations are usually differential (or difference) equations. The model or the set of differential equations describe the dynamic behavior of the system. The differential equations developed in modeling are often nonlinear. Because they are significantly more challenging to solve than linear ones, linear models are usually adequate. Linearization is the process of finding a linear model that approximates a nonlinear one. Both analysis and control design are far easier for linear than nonlinear models. The justification for using linear models is that, if a small-signal linear model is valid near an equilibrium (steady-state) and is stable, there is a region which may be small, containing the equilibrium within which the nonlinear system is stable. In other words, the deviation from equilibrium is assumed to be small so that the nonlinear functions can be approximated by linear functions.

Furthermore, if these equations can be linearized, then the Laplace transform can be utilized in order to simplify the method of solution. In practice, the complexity of systems and the lack of complete knowledge of all the relevant factors necessitate the introduction of assumptions concerning the system operation. Therefore we shall find it useful to consider the physical system, delineate some necessary assumptions, and linearize the system. Then utilizing mathematical tool such as the Laplace transform, we obtain a solution describing the operation of the system.

Figure 13:
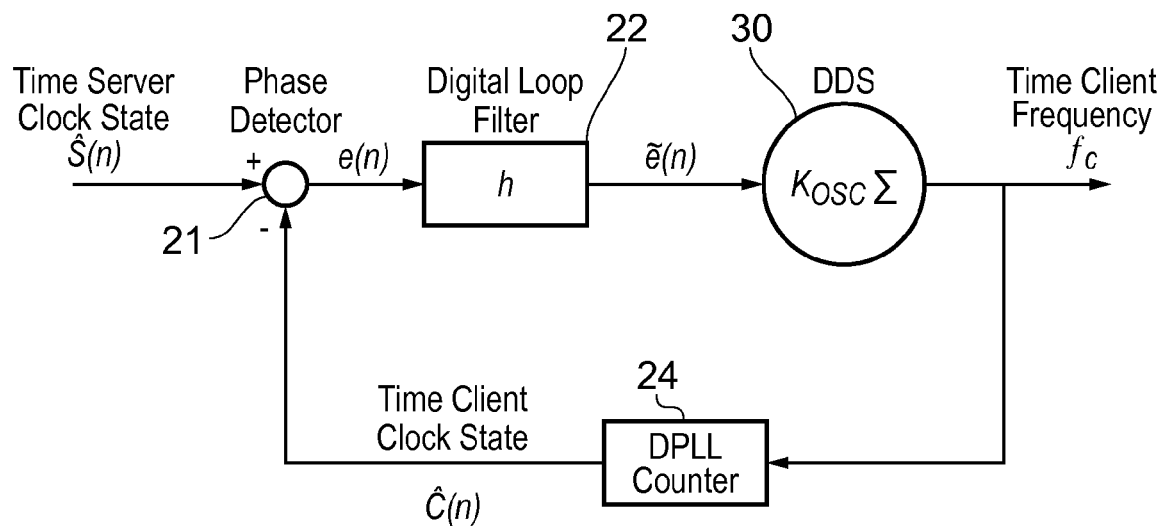
FIG. 13 shows a PLL model with a direct digital synthesizer.

A phase locked look (PLL) is essentially a feedback control system as shown in FIG. 12 and simplified to its components as "black box" operations in FIG. 13. Thus mathematical models (e.g., in the form of transfer functions) of the DDS 30 and the phase detector (PD) 21 are needed to determine the parameters of the loop filter 22. In this section, the z-transform technique is employed to analyze the general tracking (i.e., steady-state) behavior of the PLL. Under the steady-state assumption, the phase error samples are small and the general nonlinear difference equation can be approximated by a linear one which can be solved by the z-transform technique. It is noted in that when the PLL has acquired lock and is not pulled out by large phase steps, frequency steps, or phase noise applied to its reference input, its performance can be analyzed by a linear model.

Assuming that the phase error $\theta_e$ (i.e., $\theta_e(n)=\theta_s(n)-\theta_{OSC}(n)$ is the difference between the oscillator clock phase $\theta_{OSC}(n)$ and the reference clock phase $\theta_s(n)$) is within a limited range, the PLL as a feedback control system can be simplified as linear feedback control system. This assumption is reasonable for most applications since a real PLL has a bounded and limited locking range (expressed in parts-per-million, ppm, of the nominal operating frequency), outside of which locking cannot be guaranteed. The small signal linear analysis for the PLL is therefore useful for studying steady-state equilibrium behavior and stability properties under these same conditions. In the following sections, control models are developed for the phase detector 21, the controlled oscillator and, given some general structure of the loop filter 22, the PLL as a whole. The analysis will further provide design procedures for determining the parameters of the loop filter 22 that will meet certain pre-specified design and performance requirements.

Control Model of the DDS

In the DDS 30, the nominal control word $\phi_{nom}$ produces the corresponding nominal frequency $f_{nom}$. It is assumed that the control input $\phi_{nom}$ is change by the amount $\phi_{corr}$ at discrete time n. Note that change takes effect in the next discrete interval. This change results in an output frequency of $$f_{DDS}(n) = \frac{f_o}{2^q}(\phi_{nom} + \phi_{corr}(n-1)) = f_{nom} + \Delta f(n), \qquad (46)$$

or $$f_{DDS}(n) = f_{nom} + \frac{f_o}{2^q}\phi_{corr}(n-1). \qquad (47)$$

This corresponds to an angular frequency of $$\omega_{DDS}(n) = \omega_{nom} + \frac{2\pi f_o}{2^q}\phi_{corr}(n-1). \qquad (48)$$

The above equation can also be written as $$\omega_{DDS}(n) = \omega_{nom} + K_{DDS}\phi_{corr}(n-1) = \omega_{nom} + \Delta\omega(n), \quad (49)$$
where $$K_{DDS} = K_{OSC} = \frac{2\pi f_o}{2^q} \quad (50)$$

is the DDS gain. By definition, the phase of the DDS $\theta_{DDS}$ is given by the integral over the frequency variation $\Delta\omega(n)=\omega_{DDS}(n)-\omega_{nom}$ as $$\theta_{DDS}(n) = \sum_{i=0}^{n} \Delta\omega(i) = K_{DDS} \sum_{i=0}^{n} \phi_{corr}(i). \quad (51)$$

The DDS appears in the digital PLL as a digital integrator, just as the VCO appears as an analog integrator in the analog PLL.

Given that $\omega_{DDS}=2\pi f_o\phi/2^q$, the DDS gain can be obtained alternatively as $K_{DDS}=d\omega_{DDS}/d\phi=2\pi f_o/2^q$.

From the above integration, the transfer function of the DDS in the z-domain is given as $$G_{DDS}(z) = \frac{\Theta_{DDS}(z)}{\Phi_{corr}(z)} = K_{DDS} \cdot \frac{z^{-1}}{1-z^{-1}} = 2^{1-q}\pi f_o \cdot \frac{z^{-1}}{1-z^{-1}}, \quad (52)$$

where $z^{-1}$ denotes the delay operator (i.e., $z^{-1}x(n)=x(n-1)$), and $\Theta_{DDS}(z)=\Theta_{OSC}(z)$ and $\Phi_{corr}(z)$ are the z-transforms of $\theta_{DDS}(n)=\theta_{OSC}(n)$ and $\phi_{corr}(n)$, respectively.

Figure 14:
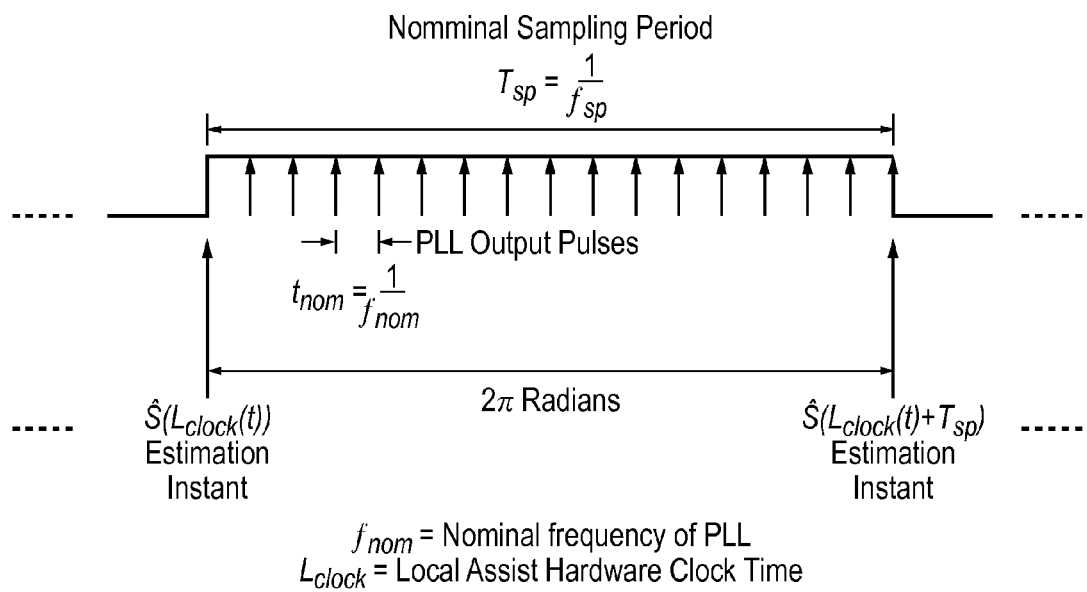
FIG. 14 shows DPLL measurement and control intervals.

Control Model of the Phase Detector $T_{sp}$ is defined as the nominal time interval between $\hat{S}$ estimation and as the sampling interval of the DPLL at the time client. The sampling interval $T_{sp}$ is quantized by the nominal client clock $f_{nom}$ into $M=T_{sp}/t_{nom}$ units as shown in FIG. 14. That is, computations are made every M DPLL clock pulses. The phase detector (PD) 21 operates at the frequency $f_{sp}=1/T_{sp}$. The interval $T_{sp}$, which is the reference operating interval for measurement and control at the DPLL 20, is equivalent to $2\pi$ radians or M nominal client clock ticks (see FIG. 14). The estimate of the server time at the client at local clock time $L_{clock}$ is denoted as $\hat{S}(L_{clock})$.

Figure 15:
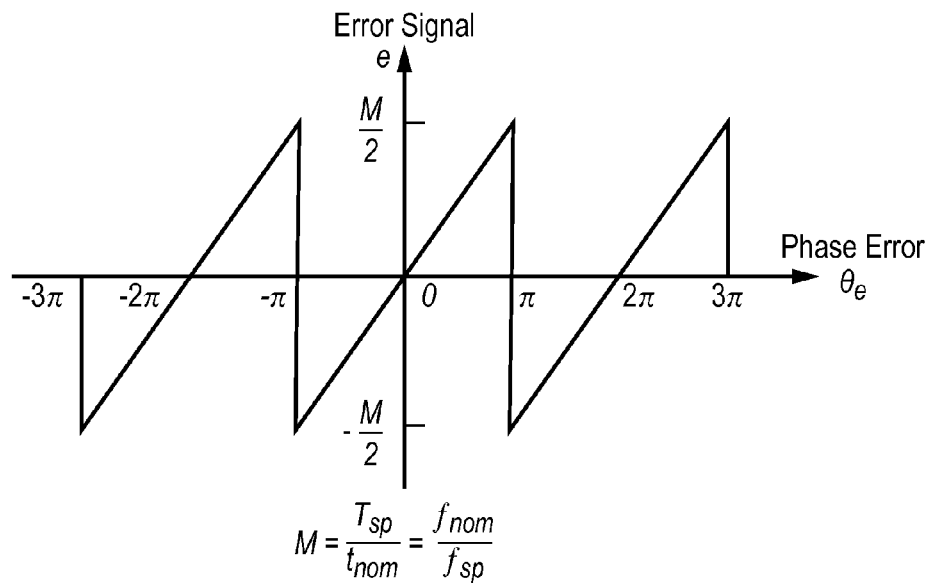
FIG. 15 shows the characteristic operation of a phase detector.

If the PD output e is plotted versus phase error $\theta_e$, a sawtooth function as shown in FIG. 15 results. This represents the characteristic curve of the PD and covers phase errors greater than $2\pi$ or smaller than $-2\pi$. The curve is periodic with period $2\pi$. The PD output is ideally linear for the entire range of input phase differences from $-2\pi$ to $2\pi$ radian and has maximum output at M, since we assuming steady-state or locked state operations of the PLL, where the linear control system models apply. Note that in the locked state, all frequencies are close to their ideal values. In this state the phase error range $[-2\pi,2\pi]$ maps to the error range $[-M,M]$.

The slope of the PD characteristic curve is equivalent to the gain of the PD. From FIG. 15, the slope is given by $$K_{PD} = \frac{M}{2\pi}. \quad (53)$$

When the phase error is restricted to the range $-2\pi<\theta_e<2\pi$, the PD output becomes $$e(\theta_e) = \frac{M}{2\pi}\theta_e = K_{PD}\theta_e. \quad (54)$$

The PD 21 measures the phase difference $\theta_e(n)=\theta_s(n)-\theta_{OSC}(n)$ between the time client DPLL controlled oscillator phase $\theta_{OSC}(n)$ and the time server (reference) clock phase $\theta_s(n)$ and develops an output $e(n)$ that is proportional to this phase difference $\theta_e(n)$. This operation can be expressed as $$e(n)=K_{PD}\cdot\theta_e(n) \quad (55)$$

The error signal output $e(n)$ is then passed to the loop filter $G_{LF}(z)$ to be processed into the filtered error $\tilde{e}(n)$. The transfer function of the PD is given as $$G_{PD}(z) = \frac{E(z)}{\Theta_e(z)} = K_{PD} = \frac{M}{2\pi}, \quad (56)$$

where $E(z)$ and $\Theta_e(z)$ are the z-transforms of $e(z)$ and $\theta_e(z)$, respectively.

Control Model of the Digital Loop Filter

The error signal $e(n)$ from the PD 21 is passed to a digital loop filter 22, the output of which is used to adjust the frequency $f_{OSC}=f_{DDS}$ of the oscillator. There are many forms of filters that can be used as the loop filter 22. For example, the digital loop filter 22 could be implemented as a proportional plus integral (PI) filter having transfer function $G_{LF}(z)$ given by $$G_{LF}(z) = \frac{\tilde{E}(z)}{E(z)} = K_1 + \frac{K_2}{1-z^{-1}}, \quad (57)$$

where $\tilde{E}(z)$ is the z-transform of the filter output $\tilde{e}(n)$, and $K_1$ and $K_2$ are the proportional and integral path gains, respectively. This transfer function is equivalent to the discrete-time control equation $$\tilde{e}(n)=\tilde{e}(n-1)+K_1(e(n)-e(n-1))+K_2e(n)$$

The loop filter being a PI filter yields a second-order PLL. The proportional gain $K_1$ and the integral gain $K_2$ determine the filter response. The filter gains $K_1$ and $K_2$, if required, can be adjusted dynamically on the fly, with greater gain in the startup process for fast locking (acquisition mode) and smaller gain in steady-state for better stability and steady-state error (tracking mode).

Control Model of the PLL at Time Client

Figure 16:
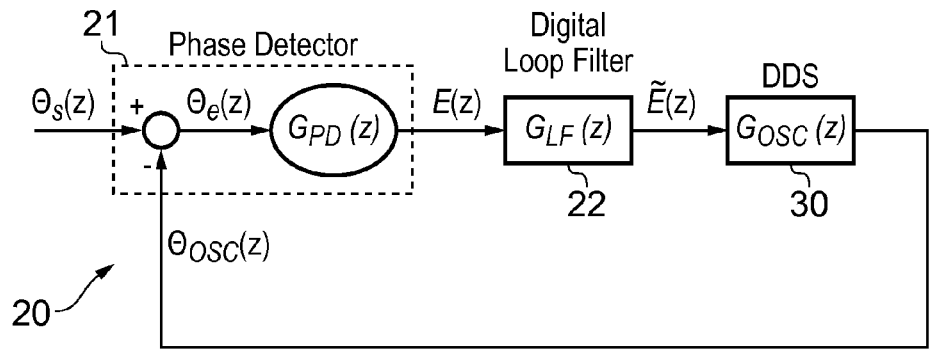
FIG. 16 shows the closed loop control model used to model the operation of a time client according to an embodiment of the present invention.
Figure 17:
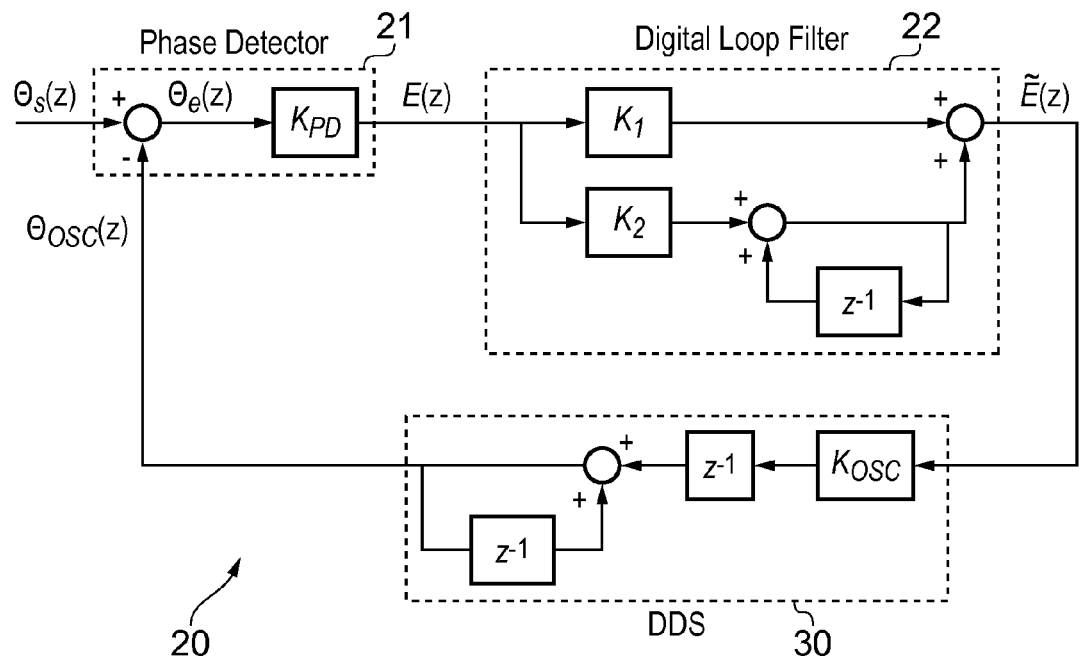
FIG. 17 shows further details of the closed loop control model of FIG. 16.

The DPLL 20 with a well-designed loop filter 22 can eventually eliminate the phase difference and make the controlled oscillator output phase and frequency lock to the reference. FIGS. 16 and 17 show the DPLL 20 as a closed-loop feedback control system.

This section describes a method for synthesizing a DPLL using standard control theory principles. The design is based on the digitization of a continuous-time system whereby the s-plane poles and zeros of a specified differential equation are mapped to the z-plane poles and zeros of a corresponding difference equation using the matched pole-zero (MPZ) method.

Linear Second-Order Model of a PLL in the s-Domain

Figure 18:
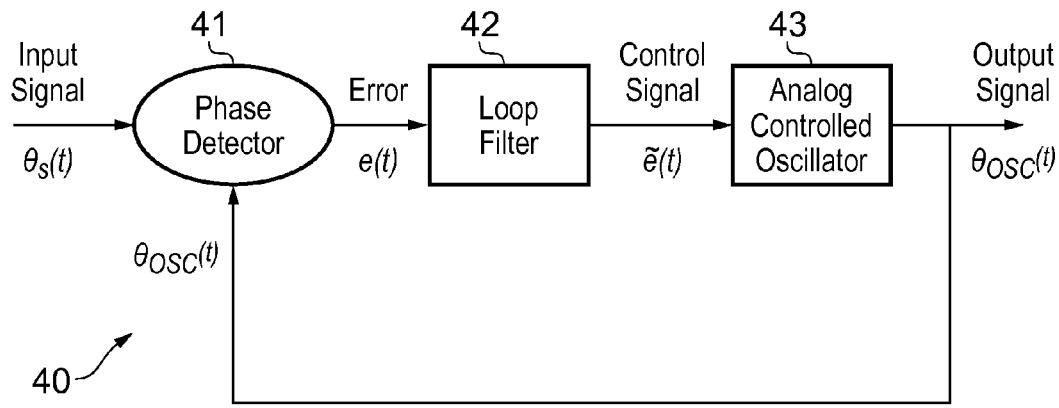
FIG. 18 is a basic block diagram of an analog phase locked loop.

The analog or continuous-time PLL 40 (see FIG. 18) consists of a phase detector 41, a loop filter 42 and voltage controlled oscillator (VCO) 43. The phase detector 41 can simply be represented by a constant gain $K_{PD}$. The VCO 43 can be modeled as a perfect integrator in the Laplace domain as $G_{VCO}(s)=K_{VCO}/s$, where $K_{VCO}$ is its gain. The loop filter 42 can be specified in Laplace domain as F(s).

In the absence of noise, the closed-loop transfer function and normalized phase error response are specified in the Laplace domain, respectively, as $$H(s) = \frac{\Theta_{VCO}(s)}{\Theta_s(s)} = \frac{K_{PD}K_{VCO}F(s)}{s + K_{PD}K_{VCO}F(s)}, \tag{58}$$

and $$\frac{\Theta_e(s)}{\Theta_s(s)} = \frac{\Theta_s(s) - \Theta_{VCO}(s)}{\Theta_s(s)} = \frac{s}{s + K_{PD}K_{VCO}F(s)} = 1 - H(s), \tag{59}$$

where $\Theta_{VCO}(s)$, $\Theta_s(s)$, and $\Theta_e(s)$ are the Laplace transforms of the VCO phase $\theta_{VCO}(t)$ reference signal phase $\theta_s(t)$, and phase error $\theta_e(t)$, respectively.

The order of the loop is equal to the number of perfect integrators within the loop structure. Since the VCO 43 is modeled as a perfect integrator the loop is at least of order 1. If the loop filter 42 contains one perfect integrator, then the loop is of order 2.

The order of the loop can be shown to greatly influence the steady-state performance of the loop. The steady-state phase error can readily be determined from (59) by means of the final value theorem, i.e., $$\lim_{t \to \infty} \theta_e(t) = \lim_{s \to 0} s\Theta_e(s) = \lim_{s \to 0} \frac{s^2 \Theta_s(s)}{s + K_{PD}K_{VCO}F(s)}. \tag{60}$$

The steady-state error is defined as the deviation of the VCO phase from the reference after the transient response has died out. The steady-state error is simply $\theta_e(\infty)$. It can be shown by means of (60) that a first-order loop or higher will track an initial phase offset with zero steady-state error. Moreover, a second-order system is required to track a frequency step, while a third-order loop must be employed to track an accelerating phase with zero steady-state error.

This paper considers a second-order lag-lead filter (also known as a proportional-integral (PI) filter) which has transfer function $$F(s) = \frac{1 + s\tau_2}{s\tau_1}, \tag{61}$$

where $\tau_1$ and $\tau_2$ are time constants of the filter. The filter has a pole at s=0 and therefore behaves like an integrator. It has (at least theoretically) infinite gain at zero frequency. The closed-loop transfer function of the PLL with this filter is obtained as $$H(s) = \frac{2\zeta\omega_n s + \omega_n^2}{s^2 + 2\zeta\omega_n s + \omega_n^2} = \frac{2\zeta\omega_n s + \omega_n^2}{(s - s_0)(s - s_1)}, \tag{62}$$

where $\omega_n$ and $\zeta$ are the natural frequency and damping factors, respectively, and are specified in terms of $K_{PD}$, $K_{VCO}$, $\tau_1$ and $\tau_2$ as $$\omega_n = \sqrt{\frac{K_{PD}K_{VCO}}{\tau_1}}, \tag{63}$$

$$\zeta = \frac{\omega_n \tau_2}{2}. \tag{64}$$

These two parameters are usually used to specify performance requirements of a system. The poles of the closed loop system are $$s_{0,1} = -\zeta\omega_n \pm j\omega_n\sqrt{1-\zeta^2}. \tag{65}$$

When $\zeta>1$, the poles are real; and when $\zeta<1$, the poles are complex and conjugate. When $\zeta=1$, the poles are repeated and real and the condition is called critical damping. When $\zeta<1$, the response is underdamped and the poles are complex.

The transient response of the closed-loop system is increasingly oscillatory as the poles approach the imaginary axis when $\zeta$ approaches zero. The above model can be directly applied to the PLL in the continuous-time domain. But for systems based on sampled data, discrete-time models have to be used.

Linear Second-Order Model of a PLL in the z-Domain

A linearized, time-invariant, approximate transfer function for the entire PLL 40 can be derived based on the conditions that nonlinearity of the system quantization is neglected. The z-domain representation of the PD 41, loop filter 42 and the controlled oscillator 43 are given, respectively, as $$G_{PD}(z) = K_{PD}, \tag{66}$$

$$G_{LF}(z) = K_1 + \frac{K_2}{1 - z^{-1}} = \frac{(K_1 + K_2)z - K_1}{z - 1}, \tag{67}$$

$$G_{OSC}(z) = \frac{K_{OSC}z^{-1}}{1 - z^{-1}} = \frac{K_{OSC}}{z - 1}. \tag{68}$$

Using these transfer functions, the closed-loop transfer function of the PLL 40 becomes $$H(z) = \frac{G_{PD}(z)G_{LF}(z)G_{OSC}(z)}{1 + G_{PD}(z)G_{LF}(z)G_{OSC}(z)}, \tag{69}$$

$$H(z) = \frac{K_{PD}K_{OSC}(K_1 + K_2)z - K_{PD}K_{OSC}K_1}{z^2 + [K_{PD}K_{OSC}(K_1 + K_2) - 2]z - (K_{PD}K_{OSC}K_1 - 1)}. \tag{70}$$

The matched pole-zero (MPZ) method will now be applied to the H(s) to obtain a discrete-time system $H_2(z)$ that is of form (or relates to the discrete transfer function) H(z). From this relationship, we will derive closed form expressions for the loop filter gains $K_1$ and $K_2$.

Matched Pole-Zero (MPZ) Method

The goal here is to map the system that meets the performance requirements specified by $\omega_n$ and damping factor $\zeta$ to a corresponding model in the z-domain. The MPZ method directly maps the s-plane poles and zeros of an analog system to the corresponding z-plane poles and zeros of a discrete-time system. Here the Modified-MPZ (MMPZ) method is used which can be described as follows:

1. Map the s-plane poles and zeros into the z-plane using the relationship, $z=e^{sT_{sp}}$, where $T_{sp}$ is the sampling interval.

The poles of H(s) at $s=-\zeta\omega_n+j\omega_n\sqrt{1-\zeta^2}$ will map to a pole of $H_2(z)$ at $$e^{T_{sp}\left(-\zeta\omega_n+j\omega_n\sqrt{1-\zeta^2}\right)}.$$

The poles of H(s) at $s=-\zeta\theta_n-j\omega_n\sqrt{1-\zeta^2}$ will map to a pole of $H_2(z)$ at $$e^{T_{sp}\left(-\zeta\omega_n-j\omega_n\sqrt{1-\zeta^2}\right)}.$$

The zero at $s=\omega_n/2\zeta$ will map to a zero of $H_2(z)$ at $e^{-\omega_n T_{sp}/2\zeta}$.

2. Form a discrete-time transfer function in z with the poles and zeros determined in the previous step.

$$H_2(z) = \frac{K_{DC}(z - e^{-\omega_n T_{sp}/2\zeta})}{\left(z - e^{T_{sp}\left(-\omega_n\zeta+j\omega_n\sqrt{1-\zeta^2}\right)}\right)\left(z - e^{T_{sp}\left(-\omega_n\zeta-j\omega_n\sqrt{1-\zeta^2}\right)}\right)}, \quad (71)$$

x where $K_{DC}$ is the DC or low-frequency gain of $H_2(z)$.

3. Set the DC or low frequency gain of the discrete-time system $H_2(z)$ equal to that of the continuous-time system H(s).

The Final Value Theorem is often used to find the steady state value of a time function given its Laplace transform or z-transform. Suppose we have a function x(t), the theorem states, in the s-domain, that $$\lim_{t\to\infty} x(t) = \lim_{s\to 0} sX(s), \quad (72)$$

where X(s) is the Laplace transform of x(t) and as long as all the poles of sX(s) are in the left half-plane (LHP) of the s-plane. In the z-domain, the theorem states that $$\lim_{k\to\infty} x(kT_{sp}) = \lim_{z\to 1}(1-z^{-1})X(z), \quad (73)$$

where X(z) is the z-transform of x(t) and if all the poles of $(1-z^{-1})X(z)$ are inside the unit circle. The theorem can also be use to find the DC gain of a system. The DC gain is the ratio of the output of a system to inputs (input presumed constant) after all transients have decayed. To find the DC gain, we assume there is a unit step input and use the Final Value Theorem to compute the steady state value of the output. Therefore for a system with transfer function G(s), the DC gain is defined as $$DC \text{ gain} = \lim_{s\to 0} sG(s)\frac{1}{s} = \lim_{s\to 0} G(s), \quad (74)$$

and for a system with transfer function G(z), the DC gain is defined as $$DC \text{ gain} = \lim_{z\to 1}(1-z^{-1})G(z)\frac{1}{1-z^{-1}} = \lim_{z\to 1} G(z). \quad (75)$$

The DC gain of H(s) is obtained as $$\lim_{s\to 0} H(s) = 1.$$

Setting the DC gain of $H_2(z)$ to that of H(s) we see that $K_{DC}=1$.

Therefore, the transfer function $H_2(Z)$ simplifies to $$H_2(z) = \frac{(z - e^{-\omega_n T_{sp}/2\zeta})}{\left(z - e^{T_{sp}\left(-\omega_n\zeta+j\omega_n\sqrt{1-\zeta^2}\right)}\right)\left(z - e^{T_{sp}\left(-\omega_n\zeta-j\omega_n\sqrt{1-\zeta^2}\right)}\right)}. \quad (76)$$

Digital Loop Filter Gains

The transfer function $H_2(z)$ can further be expressed as $$H_2(z) = \frac{z - e^{-\omega_n T_{sp}/2\zeta}}{z^2 - 2e^{-2\zeta\omega_n T_{sp}}\cos(\omega_n T_{sp}\sqrt{1-\zeta^2})z + e^{-2\zeta\omega_n T_{sp}}}. \quad (77)$$

Now comparing the denominators (or characteristic functions) of H(z) and $H_2(Z)$ will be seen that $$-K_{PD}K_{OSC}K_1 + 1 = e^{-2\zeta\omega_n T_{sp}}, \quad (78)$$

$$K_1 = \frac{1}{K_{PD}K_{OSC}}[1 - e^{-2\zeta\omega_n T_{sp}}], \quad (79)$$

$$K_{PD}K_{OSC}(K_1 + K_2) - 2 = -2e^{-\zeta\omega_n T_{sp}}\cos(\omega_n T_{sp}\sqrt{1-\zeta^2}), \quad (80)$$

$$K_2 = \frac{1}{K_{PD}K_{OSC}}[1 + e^{-2\zeta\omega_n T_{sp}} - 2e^{-\zeta\omega_n T_{sp}}\cos(\omega_n T_{sp}\sqrt{1-\zeta^2})]. \quad (81)$$

Typically, performance specification for feedback control systems often involves certain requirements associated with the time response of the system. The setting time, $t_{set}$, is defined as the time it takes for the system transients to decay. For the PLL, $t_{set}$ is also referred to as the locking time. For the second-order system with $0\leq\zeta<1$, the setting time (for the system to settle within 1% of the input amplitude) is given by $$t_{set} = \frac{4.6}{\zeta\omega_n}. \quad (82)$$

Thus, for a second-order system, by specifying the settling time, $t_{set}$, and the damping factor (e.g., $\zeta=0.707$), the undamped natural frequency $\omega_n$, and the filter gains $K_1$ and $K_2$ can easily be determined from the above equations.

Designers of Telecom PLLs typically adopted the following approach to determine the PLL parameters. The damping ratios in PLLs and clocks in telecom systems typically have gain peaking of 0.1 dB or 0.2 dB, respectively (corresponding to damping ratios of 4.3188 and 2.9585, respectively). This makes telecom synchronization overdamped systems. In a second-order PLL, the loop bandwidth $B_w$, damping ratio $\zeta$, and natural frequency $\omega_n$ are related by $$B_w = \frac{\omega_n}{2\pi} \sqrt{2\zeta^2 + 1 + \sqrt{(2\zeta^2 + 1)^2 + 1}} . \tag{83}$$

Following telecom industry practice, the second-order PLL with PI filter are implemented to have closed-loop bandwidth $B_w=1$ Hz or less and damping ratio $\zeta \geq 3$. Thus, for our second-order PLL, by specifying $B_w$ and $\zeta$, the natural frequency $\omega_n$, and the filter gains $K_1$ and $K_2$ can easily be determined from the above equations.

Figure 19:
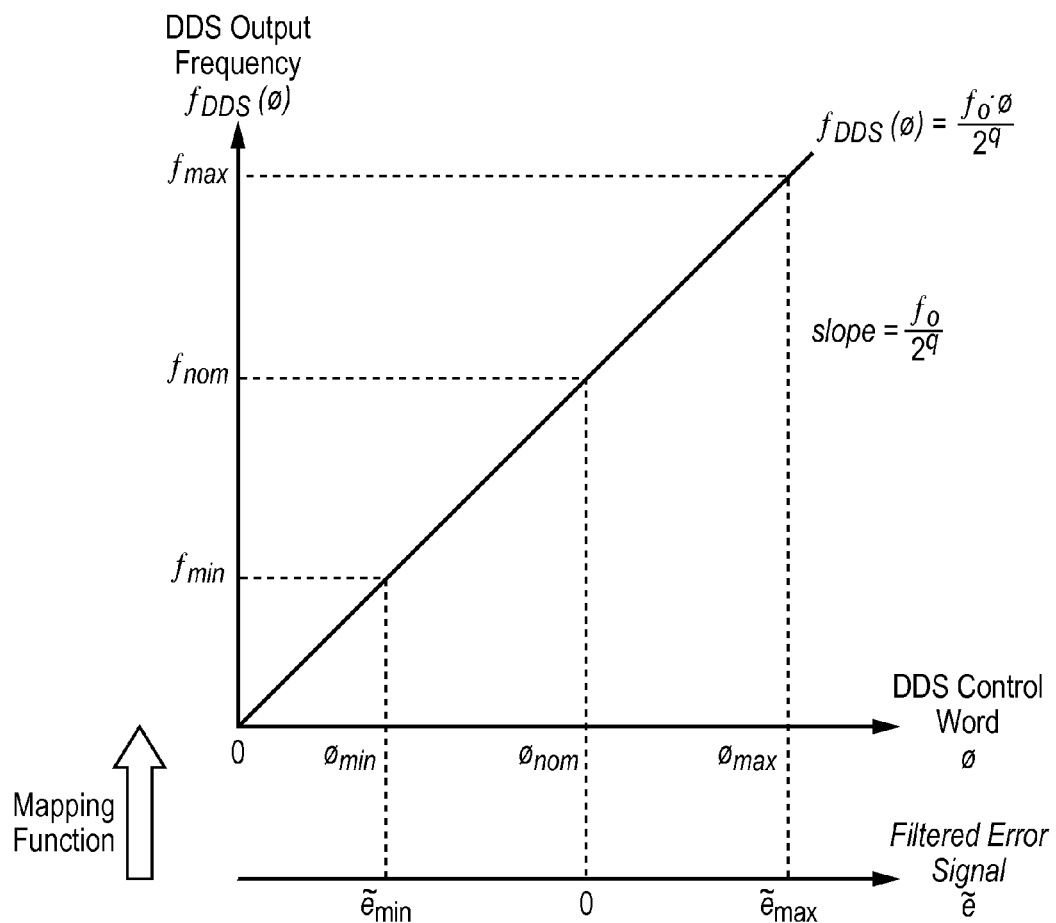
FIG. 19 shows the characteristics of a direct digital synthesizer and its input mapping function.

Using the loop filter gains $K_1$ and $K_2$, and the error $e(n)$, the control equation becomes $\tilde{e}(n)=\tilde{e}(n-1)+K_1(e(n)-e(n-1))+K_2 e(n)$. The filtered error can then be mapped to a corresponding DDS input control word using a mapping function as depicted in FIG. 19. A much simpler mapping function is where the DDS correction factor is computed as $$\Delta\phi(n)=\tilde{e}(n)\cdot M, \tag{84}$$

and the DDS control word is obtained from $$\phi(n)=\phi_{nom}+\Delta\phi(n) \tag{85}$$

The systems and methods of the above embodiments may be implemented in a computer system (in particular in computer hardware or in computer software) in addition to the structural components and user interactions described.

The term "computer system" includes the hardware, software and data storage devices for embodying a system or carrying out a method according to the above described embodiments. For example, a computer system may comprise a central processing unit (CPU), input means, output means and data storage. Preferably the computer system has a monitor to provide a visual output display (for example in the design of the business process). The data storage may comprise RAM, disk drives or other computer readable media. The computer system may include a plurality of computing devices connected by a network and able to communicate with each other over that network.

The methods of the above embodiments may be provided as computer programs or as computer program products or computer readable media carrying a computer program which is arranged, when run on a computer, to perform the method(s) described above.

The term "computer readable media" includes, without limitation, any non-transitory medium or media which can be read and accessed directly by a computer or computer system. The media can include, but are not limited to, magnetic storage media such as floppy discs, hard disc storage media and magnetic tape; optical storage media such as optical discs or CD-ROMs; electrical storage media such as memory, including RAM, ROM and flash memory; and hybrids and combinations of the above such as magnetic/optical storage media.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

In particular, although the methods of the above embodiments have been described as being implemented on the systems of the embodiments described, the methods and systems of the present invention need not be implemented in conjunction with each other, but can be implemented on alternative systems or using alternative methods respectively.

REFERENCES

[1]. M. Ouellette, Kuiwen Ji, Song Liu, and Han Li, "Using IEEE 1588 and boundary clocks for clock synchronization in telecom networks," *IEEE Commun. Mag.*, February 2011, pp. 164-171.

[2]. M. Ouellette, G. Garner, and S. Jobert, "Simulations of a chain of Telecom Boundary Clocks combined with Synchronous Ethernet for phase/time transfer," 2011 *International IEEE Symposium on Precision Clock Synchronization for Measurement Control and Communication (ISPCS)*, 12-16 Sep. 2011, pp. 105-113.

[3]. R. E. Kalman, "A New Approach to Linear Filtering and Prediction Problems," *Transaction of the ASME—Journal of Basic Engineering*, March 1960, pp. 35-45.

[4]. B. Chun, B. Kim; Y. H. Lee, "Generalization of exponentially weighted RLS algorithm based on a state-space model," *Proc. of the* 1998 *IEEE Inter. Symp. on Circuits and Systems*, Vol. 5, 1998, pp. 198-201.

All references referred to above are hereby incorporated by reference.

The invention claimed is:

1. A slave device connected to a master device having a master clock over a network, wherein the slave device includes:
   a slave clock; and
   a digital phase locked loop including a phase detector, a loop filter, a phase accumulator and a counter, wherein:
   the slave device is arranged to:
      exchange with the master device, timing messages and to record timestamps which are: the time of sending of said timing messages from the master device according to the master clock; the time of receipt of said timing messages according to the slave clock; the time of sending of said timing messages according to the slave clock; and the time of receipt of said timing messages according to the master clock,
      estimate the skew and offset of the slave clock relative to the master clock from said timestamps; and
      synchronize said slave clock to the master clock based on the estimated skew and offset to produce a master time estimate;
   the digital phase locked loop processes the master time estimate as follows:
      on receipt of a first estimate of the master time, the counter is initialised;
      on receipt of subsequent estimates of the master time, the phase detector is arranged to detect a phase difference between the output of the counter and the received estimate and produce an error signal representing that difference;
      the error signal is filtered by the loop filter to produce a filtered error signal;
      the filtered error signal is used to control the frequency of the phase accumulator; and
      the output of the phase accumulator increments the counter and also provides a clock frequency of the slave clock which is synchronized to the frequency of the master clock; and wherein the slave device uses the output of the counter as the clock time of the slave clock which is synchronized to the time of the master clock.

2. The slave device according to claim 1 further comprising a direct digital synthesizer producing an analog frequency signal from the output of the phase accumulator, the direct digital synthesizer including:
the phase accumulator;
an oscillator;
a mapping device; and
a digital-to-analog converter.

3. The slave device according to claim 2 further comprising a low-pass filter arranged to filter the output of the direct digital synthesizer.

4. The slave device according to claim 1 wherein the counter of the digital phase locked loop is also used to provide timestamps for the time of receipt and of sending of timing messages at/from the slave device.

5. The slave device according to claim 4 wherein the counter is initialized on receipt by the slave device of the first timing message from the master device, and the counter is reset on receipt of the first master time estimate to said first master time estimate.

6. The slave device according to claim 1 further comprising a second free-running counter, wherein the second counter is used to provide timestamps for the time of receipt and sending of timing messages at/from the slave device.

7. The slave device according to claim 1, wherein the slave device is arranged to estimate the skew and offset of the slave clock relative to the master clock by applying an exponentially weighted recursive least squares algorithm to a state-space formulation of the frequency and time of the slave clock and the timestamps.

8. The slave device according to claim 1, wherein the slave device is arranged to estimate the skew and offset of the slave clock relative to the master clock by applying an exponentially weighted recursive least squares algorithm as follows:

a) initializing the algorithm by setting:

$$\hat{X}_{0,-1} = \overline{0}$$

$$\overline{P}_{0,-1} = \gamma^{-1}\overline{I}, \gamma \text{ is a small positive constant}$$

$$n=1$$

b) setting the state prediction for the current time n as:

$$\hat{X}_{n,n-1} = \overline{A}_{n-1}\hat{X}_{n-1,n-1}$$

c) calculating:

$$\overline{P}_{n,n-1} = \frac{\overline{A}_{n-1}\overline{P}_{n-1,n-1}\overline{A}_{n-1}^T}{\lambda_n}$$

d) calculating the Kalman gain vector:

$$\overline{K}_n = \frac{\overline{P}_{n,n-1}\overline{D}_n}{\overline{D}_n^T\overline{P}_{n,n-1}\overline{D}_n + 1}$$

e) updating the state estimate:

$$\hat{X}_{n,n} = \hat{X}_{n,n-1} + \overline{K}_n(y_n - \overline{D}_n^T\hat{X}_{n,n-1})$$

f) calculating:

$$\overline{P}_{n,n} = (\overline{I} - \overline{K}_n\overline{D}_n^T)\overline{P}_{n,n-1}$$

g) incrementing n:

$$n = n+1$$

h) repeating from b) above,
wherein:
$\hat{X}_n$ is the estimate of the state vector $\overline{X}_n$ which expresses the offset and skew of the slave clock at time n in vector form;
$\overline{A}_n$ is the state transition matrix, which, for a two-dimensional state-space in discrete time, can be approximated as $$\overline{A} \approx \Phi(\Delta t) = \begin{bmatrix} 1 & \Delta t \\ 0 & 1 \end{bmatrix}$$

where $\Delta t$ is the sampling time;
$\lambda_n$ is the forgetting factor at time n;
$y_n$ is the measurement at time n; and
$\overline{D}_n$ is a known measurement vector derived from the timestamps at time n.

9. The slave device according to claim 8, wherein the forgetting factor $\lambda_n$ is dynamic.

10. A method of synchronizing the time and frequency of a slave clock in a slave device to a master clock in a master device which is connected to the slave device over a network, the method including the steps of:
exchanging, between the master device and the slave device, timing messages and timestamps which are: the time of sending of timing messages from the master device according to the master clock; the time of receipt of said timing messages according to the slave clock; the time of sending of said timing messages according to the slave clock; and the time of receipt of said timing messages according to the master clock,
estimating the skew and offset of the slave clock relative to the master clock from said timestamps; and
synchronizing said slave clock to the master clock based on the estimated skew and offset to produce a master time estimate;
using a digital phase locked loop including a phase detector, a loop filter, a phase accumulator and a counter, processing the master time estimate as follows:
on receipt of a first estimate of the master time, initializing the counter;
on receipt of subsequent estimates of the master time, detecting, using the phase detector, a phase difference between the output of the counter and the received estimate and producing an error signal representing that difference;
filtering the error signal using the loop filter to produce a filtered error signal;
controlling the frequency of the phase accumulator using the filtered error signal; and
incrementing counter using the output of the phase accumulator, and
obtaining a clock frequency of the slave clock which is synchronized to the frequency of the master clock as the output of the phase accumulator; and
wherein the output of the counter as the clock time of the slave clock which is synchronized to the time of the master clock.

11. The method according to claim 10 further including the step of producing an analog frequency signal from the output of the phase accumulator using a direct digital synthesizer including the steps of:

mapping the output of the phase accumulator to produce a digital waveform; and converting said digital waveform to an analog waveform using a digital-to-analog converter.

12. The method according to claim 11 further including the step of low-pass filtering the analog waveform to produce a smoothed waveform.

13. The method according to claim 10 wherein the timestamps for the time of receipt and of sending of timing messages at/from the slave device are provided by the counter of the digital phase locked loop.

14. The method according to claim 13 further including the steps of:
  initializing the counter on receipt by the slave device of the first timing message from the master device, and
  resetting the counter to said first master time estimate on receipt of the first master time estimate.

15. The method according to claim 10 wherein the timestamps for the time of receipt and sending of timing messages at/from the slave device are provided by a second free-running counter.

16. The method according to claim 10, wherein the step of estimating the offset and skew of the slave clock compared to the master clock applies an exponentially weighted recursive least squares algorithm to a state-space formulation of the frequency and time of the slave clock and the timestamps.

17. The method according to claim 10, wherein the step of estimating the offset and skew of the slave clock compared to the master clock applies an exponentially weighted recursive least squares algorithm as follows:

a) initializing the algorithm by setting:

$$\hat{X}_{0,-1} = \overline{0}$$

$$\overline{P}_{0,-1} = \gamma^{-1}\overline{I}, \gamma \text{ is a small positive constant}$$

$$n=1$$

b) setting the state prediction for the current time n as:

$$\hat{X}_{n,n-1} = \overline{A}_{n-1}\hat{X}_{n-1,n-1}$$

c) calculating:

$$\overline{P}_{n,n-1} = \frac{\overline{A}_{n-1}\overline{P}_{n-1,n-1}\overline{A}_{n-1}^T}{\lambda_n}$$

d) calculating the Kalman gain vector:

$$\overline{K}_n = \frac{\overline{P}_{n,n-1}\overline{D}_n}{\overline{D}_n^T\overline{P}_{n,n-1}\overline{D}_n + 1}$$

e) updating the state estimate:

$$\hat{X}_{n,n} = \hat{X}_{n,n-1} + \overline{K}_n(y_n - \overline{D}_n^T\hat{X}_{n,n-1})$$

f) calculating:

$$\overline{P}_{n,n} = (\overline{I} - \overline{K}_n\overline{D}_n^T)\overline{P}_{n,n-1}$$

g) incrementing n:

$$n = n+1$$

h) repeating from b) above, wherein:
  $\hat{X}_n$ is the estimate of the state vector $\overline{X}_n$ which expresses the offset and skew of the slave clock at time n in vector form;
  $\overline{A}_n$ is the state transition matrix, which, for a two-dimensional state-space in discrete time, can be approximated as $$\overline{A} \approx \Phi(\Delta t) = \begin{bmatrix} 1 & \Delta t \\ 0 & 1 \end{bmatrix}$$

where $\Delta t$ is the sampling time;
  $\lambda_n$ is the forgetting factor at time n;
  $y_n$ is the measurement at time n; and
  $\overline{D}_n$ is a known measurement vector derived from the timestamps at time n.

18. The method according to claim 17, wherein the forgetting factor $\lambda_n$ is dynamic.

19. A time and frequency synchronisation system for a network, the system including:
  a master device having a master clock;
  a slave device having a slave clock; and
  a network connecting the master and slave devices,
wherein:
  the slave clock comprises:
    a slave clock; and
    a digital phase locked loop including a phase detector, a loop filter, a phase accumulator and a counter,
  wherein:
    the slave device is arranged to:
      exchange with the master device, timing messages and to record timestamps which are: the time of sending of said timing messages from the master device according to the master clock; the time of receipt of said timing messages according to the slave clock; the time of sending of said timing messages according to the slave clock; and the time of receipt of said timing messages according to the master clock,
      estimate the skew and offset of the slave clock relative to the master clock from said timestamps; and
      synchronize said slave clock to the master clock based on the estimated skew and offset to produce a master time estimate;
    the digital phase locked loop processes the master time estimate as follows:
      on receipt of a first estimate of the master time, the counter is initialised;
      on receipt of subsequent estimates of the master time, the phase detector is arranged to detect a phase difference between the output of the counter and the received estimate and produce an error signal representing that difference;
      the error signal is filtered by the loop filter to produce a filtered error signal;
      the filtered error signal is used to control the frequency of the phase accumulator; and
    the output of the phase accumulator increments the counter and also provides a clock frequency of the slave clock which is synchronized to the frequency of the master clock; and
  wherein the slave device uses the output of the counter as the clock time of the slave clock which is synchronized to the time of the master clock.

20. The system according to claim 19 wherein the slave device further comprises a direct digital synthesizer producing an analog frequency signal from the output of the phase accumulator, the direct digital synthesizer including:
 the phase accumulator;
 an oscillator;
 a mapping device; and
 a digital-to-analog converter.

21. The system according to claim 20 wherein the slave device further comprises a low-pass filter arranged to filter the output of the direct digital synthesizer.

22. The system according to claim 19 wherein the counter of the digital phase locked loop is also used to provide timestamps for the time of receipt and of sending of timing messages at/from the slave device.

23. The system according to claim 22 wherein the counter is initialized on receipt by the slave device of the first timing message from the master device, and the counter is reset on receipt of the first master time estimate to said first master time estimate.

24. The system according to claim 19 wherein the slave device further comprises a second free-running counter, wherein the second counter is used to provide timestamps for the time of receipt and sending of timing messages at/from the slave device.

25. The time and frequency synchronisation system according to claim 19, wherein the slave device is arranged to estimate the skew and offset of the slave clock relative to the master clock by applying an exponentially weighted recursive least squares algorithm to a state-space formulation of the frequency and time of the slave clock and the timestamps.

26. The system according to claim 19, wherein the slave device is arranged to estimate the skew and offset of the slave clock by applying an exponentially weighted recursive least squares algorithm as follows:
 a) initializing the algorithm by setting:

$$\hat{X}_{0,-1} = \overline{0}$$

$$\overline{P}_{0,-1} = \gamma^{-1}\overline{I}, \gamma \text{ is a small positive constant}$$

$$n = 1$$

b) setting the state prediction for the current time n as:

$$\hat{X}_{n,n-1} = \overline{A}_{n-1}\hat{X}_{n-1,n-1}$$

c) calculating:

$$\overline{P}_{n,n-1} = \frac{\overline{A}_{n-1}\overline{P}_{n-1,n-1}\overline{A}_{n-1}^T}{\lambda_n}$$

d) calculating the Kalman gain vector:

$$\overline{K}_n = \frac{\overline{P}_{n,n-1}\overline{D}_n}{\overline{D}_n^T\overline{P}_{n,n-1}\overline{D}_n + 1}$$

e) updating the state estimate:

$$\hat{X}_{n,n} = \hat{X}_{n,n-1} + \overline{K}_n(y_n - \overline{D}_n^T\hat{X}_{n,n-1})$$

f) calculating:

$$\overline{P}_{n,n} = (\overline{I} - \overline{K}_n\overline{D}_n^T)\overline{P}_{n,n-1}$$

g) incrementing n:

$$n = n+1$$

h) repeating from b) above,
 wherein:
  $\hat{X}_n$ is the estimate of the state vector $\overline{X}_n$ which expresses the offset and skew of the slave clock at time n in vector form;
  $\overline{A}_n$ is the state transition matrix, which, for a two-dimensional state-space in discrete time, can be approximated as $$\overline{A} \approx \Phi(\Delta t) = \begin{bmatrix} 1 & \Delta t \\ 0 & 1 \end{bmatrix}$$

where $\Delta t$ is the sampling time;
  $\lambda_n$ is the forgetting factor at time n;
  $y_n$ is the measurement at time n; and
  $\overline{D}_n$ is a known measurement vector derived from the timestamps at time n.

27. The system according to claim 26, wherein the forgetting factor $\lambda_n$ is dynamic.

* * * * *